United States Patent
Ren et al.

(10) Patent No.: US 8,618,480 B2
(45) Date of Patent: Dec. 31, 2013

(54) CHARGED PARTICLE BEAM APPARATUS

(71) Applicant: Hermes Microvision Inc., Hsinchu (TW)

(72) Inventors: Weiming Ren, San Jose, CA (US); Xiaoli Guo, Beijing (CN); Xuedong Liu, San Jose, CA (US); Zhongwei Chen, San Jose, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

(21) Appl. No.: 13/848,854

(22) Filed: Mar. 22, 2013

(65) Prior Publication Data

US 2013/0277554 A1    Oct. 24, 2013

Related U.S. Application Data

(60) Provisional application No. 61/614,715, filed on Mar. 23, 2012.

(51) Int. Cl.
  *H01J 37/26*  (2006.01)
  *H01J 37/28*  (2006.01)
  *H01J 37/141* (2006.01)

(52) U.S. Cl.
  USPC ............... 250/311; 250/310; 250/396 ML

(58) Field of Classification Search
  USPC ...... 250/306, 307, 309–311, 396 R, 396 ML, 250/397, 398
  See application file for complete search history.

(56) References Cited

U.S. PATENT DOCUMENTS

| | | | |
|---|---|---|---|
| 6,392,231 B1 * | 5/2002 | Chen | 250/310 |
| 7,523,009 B2 * | 4/2009 | Preikszas et al. | 702/107 |
| 7,960,697 B2 * | 6/2011 | Chen et al. | 250/310 |
| 8,319,192 B2 * | 11/2012 | Ren | 250/396 R |
| 2004/0188612 A1 * | 9/2004 | Ose et al. | 250/310 |
| 2012/0049064 A1 * | 3/2012 | Ren | 250/310 |
| 2013/0153782 A1 * | 6/2013 | Ren et al. | 250/398 |

* cited by examiner

*Primary Examiner* — Bernard E Souw
(74) *Attorney, Agent, or Firm* — WPAT, PC; Justin King

(57) ABSTRACT

The present invention provides a charged particle beam apparatus which employs LVSEM to inspect sample surface with a throughput much higher than the prior art. The high throughput is realized by providing a probe current and a FOV both several times of those of the prior art. Accordingly several means are proposed to avoid obvious degradation of image resolution due to the increases in Coulomb effect and geometric aberrations, and increase efficiency and uniformity of secondary charged particle collection.

29 Claims, 14 Drawing Sheets

CHARGED PARTICLE BEAM APPARATUS

CLAIM OF PRIORITY

This application claims the benefit of priority of U.S. provisional application No. 61/614,715 entitled to inventors filed Mar. 23, 2012 and entitled "Charged Particle Beam Apparatus", the entire disclosures of which are incorporated herein by reference.

BACKGROUND OF THE INVENTION

1. Field of the Invention

The present invention relates to a charged particle beam apparatus which employs a scanning electron microscope (SEM) to inspect and/or review defects on a sample surface. More particularly, it relates to a low-voltage scanning electron microscope (LVSEM) for inspecting and/or reviewing defects on surfaces of wafers or masks in semiconductor manufacturing industry.

2. Description of the Prior Art

In semiconductor manufacturing industry, defects can occur on surfaces of masks and wafers during semiconductor fabrication process. These defects impact yield to a great degree. Apparatuses or tools, which can do defect inspection and/or defect review that are typically based on microscopy, have been employed to monitor semiconductor manufacturing yield. The apparatuses are always desired to have high spatial resolution and high throughput. Since critical feature dimensions of patterns on wafer and mask shrunk to or even beyond the competent ability limit of photon microscopy, SEM has been widely employed. Comparing a photon microscope, SEM not only can detect smaller defect sizes due to its higher imaging resolution, but also is able to detect electric defects due to its charging ability.

FIG. 1A and FIG. 1B show a conventional SEM for defect inspection and/or review in semiconductor manufacturing. In FIG. 1A, a primary electron (PE) beam 2 is emitted from an electron source 1 and accelerated to a higher energy by an anode 3. A fixed gun aperture 4 limits the current of the beam 2 to a desired value. Next, the PE beam 2 is focused to become a small probe spot on the surface of a sample 12 by a condenser lens 5 and an objective lens 10. The focusing power of the condenser lens 5 and the opening size of a final beam-limit aperture 6 are selected to get a desired probe current and make the probe spot size as smaller as possible. To obtain small spot sizes over a large range of probe current, usually the beam-limit aperture 6 has multiple openings with various sizes. As shown in FIG. 1B, secondary electrons (SE) and backscattered electrons (BSE) will emerge from the sample surface where the probe spot is, which form SE beam 13 and BSE beam 14 respectively. An in-lens detector 7 can collect SE and/or BSE. To collect BSE only, the voltage difference between the electrode 11 and the sample 12 are adjusted to reflect SE back to the sample surface. As the PE beam 2 is dynamically deflected by either or both of deflectors 8 and 9, the probe spot scans the sample surface and the SE and/or BSE images of sample surface can be obtained. A SE image and a BSE image comprise topographic information and material information respectively.

An interaction between each of primary electrons and a sample may generate radiation damage to the sample surface and makes exit areas of SE and BSE larger than the probe spot. To weaken the interaction, the primary electrons usually have energies at least lower than 5 keV and a SEM in such a case is especially named as LVSEM. However Coulomb interactions among primary electrons get stronger with decrease in electron kinetic energy, and the effect (Coulomb Effect) due to the Coulomb interaction will enlarge the probe spot size. Therefore in a LVSEM, primary electrons usually travel with high kinetic energies through most portions of their paths and are subsequently decelerated to desired low final landing energies just prior to impinging onto the sample, which is usually called as retarding technology.

Application requirements of defect inspection and/or defect review are diversified and changed with respect to new technologies emerging in semiconductor manufacturing. For example, to increase integration degree of IC chips, instead of further reducing feature dimensions on a wafer, 3-D chip integration is proposed and coming into market. 3-D integration can form highly integrated systems by vertically stacking and connecting various materials, technologies and functional components together. Various technologies for realizing 3-D integration are pursued. In 3D packaging technology, Die-to-die 3D integration is enabled by thinned die-to-die bonding and through-silicon-via (TSV) interconnections, and consequently requires defect inspection over a full TSV wafer. Therefore, TSV defect inspection especially requires a throughput much higher than the prior art. Accordingly, LVSEM for TSV defect inspection needs to have a probe current (such as several to tens uA) and a field of view (FOV) (such as several mm) both much larger than those of the prior art, such as ten or more times. Increasing probe current and FOV will dramatically increase the probe spot sizes all over the FOV in LVSEM. Although a TSV is typically several microns in diameter, which is much larger than feature dimensions on each die, reducing the probe spot size to match the TSV dimension is still difficult. Further, for inspecting patterns with large critical feature dimensions on a sample surface, an electron-beam (e-beam) inspection tool cannot compete with an optical inspection tool in throughput although it can detect electric defects but the optical inspection tool cannot.

As the probe current and the FOV increase, some minor issues in prior art of LVSEM become critical and must be solved, such as the Coulomb Effect due to the secondary electrons (SEs) and the backscattered electrons (BSEs) and the grey level uniformity of each of the SE and BSE images over the entire FOV. A super large probe current will incur a supper strong Coulomb Interactions among all the electrons on the path of primary electron beam from the electron source to the sample surface. In the prior art, the Coulomb Effect due to the SEs and BSEs can be ignored because the SE beam and the BSE beam are small in beam current (nearly equal to probe current) and large in beam size (several millimeters, in comparison with sub-millimeter size of the PE beam). Therefore, a lot of endeavors in designing LVSEM are focused onto eliminating crossovers of primary electron beam and less attention is paid to avoid the appearance of SE and BSE crossovers such as 15 and 16 in FIG. 1B.

The grey level uniformity of each of the SE and BSE images over a FOV mainly depends on the uniformities of the probe spot size of the PE beam and the detection ratio of the corresponding electrons. Over a FOV, the probe spot size will increase as the primary electron beam lands far from the FOV center due to the appearance and increase of off-axis aberrations. Off-axis aberrations of the primary electron beam increase with the off-axis shift R and the convergent angle $\alpha$ thereof on the sample surface. For a super large FOV, the field curvature (FC) aberration will dominate off-axis aberrations because it depends on $R^2 \cdot \alpha$ as well as FC coefficient. In the prior art, the objective lens is put close to the sample as much as possible so as to reduce spherical and chromatic aberration coefficients. The working distance is usually not large than 2 mm In such a case, the angular magnification and the FC coefficient are very large, and both mean a large FC aberration.

SE and/or BSE beams scan the in-lens detector surface as the primary electron beam scans the sample surface. The scanning range on the detector depends on the FOV size, the imaging magnification of the objective lens and the deflection sensitivity of scanning deflectors both with respect to SE and BSE. Because the detection area of a detector cannot be too large due to limitation of electric respond characteristics, a super large FOV will require a relatively small magnification of the objective lens with respect to SE and BSE. As mentioned above, in the prior art, the objective lens is put very close to the sample to reduce spherical and chromatic aberration coefficients. In such a case, imaging magnification of the objective lens with respect to SE and BSE is very large, thereby limiting the available size of FOV due to the limitation on the detector size.

Accordingly, a new LVSEM, which can provide a probe current and a field of view (FOV) both much larger than those of the prior art, is needed. In addition, it is also desired to have SE image and BSE image simultaneously.

SUMMARY OF THE INVENTION

The object of this invention is to provide an electron beam apparatus employing LVSEM technology to inspect a sample surface. By specifically designing and arranging PE beam imaging and SE and/or BSE collection in the apparatus, the apparatus can provide a probe current and a FOV both much larger than those of the prior art. So, this invention will especially benefit the defect inspection and review in semiconductor yield management, such as TSV defect inspection in 3-D integration.

Accordingly, the invention therefore provides a charged particle beam apparatus, which comprises a charged particle source, an accelerating electrode below the charged particle source, a first selectable beam-limit aperture plate below the accelerating electrode, a magnetic condenser lens below the first selectable beam-limit aperture plate, a magnetic objective lens below the magnetic condenser lens, a retarding electrode inside or below the magnetic objective lens, a sample stage below the retarding electrode for supporting a sample, a deflection unit above the sample, and a first charged-particle detector above the deflection unit. The charged particle source emits primary charged particles along a direction, wherein the direction is an optical axis of the charged particle beam apparatus and the primary charged particles form a primary charged particle beam. The accelerating electrode comprises a first beam-passing opening aligned with the optical axis for the primary charged particle beam passing through, wherein the charged particle source and the accelerating electrode are excited to generate an accelerating field therebetween to accelerate the primary charged particles. The first selectable beam-limit aperture plate comprises a first plurality of beam-limit openings, wherein one of the first plurality of beam-limit openings in use is aligned with the optical axis and limits a current of the primary charged particle beam to a first current value. The magnetic condenser lens and the magnetic objective lens are both aligned with the optical axis. The retarding electrode comprises a second beam-passing opening aligned with the optical axis for the primary charged particle beam passing through. The retarding electrode and the sample are electrically excited to generate a retarding field therebetween so that primary charged particles are decelerated to land on a surface of the sample with kinetic energies lower than 5 keV. The magnetic condenser lens and the magnetic objective lens focus the primary charged particle beam to forms a focused probe spot onto the surface of the sample. The deflection unit deflects the primary charged particle beam so as to make the focused probe spot scan the surface of the sample. The first charged-particle detector comprises a third beam-passing opening aligned with the optical axis for the primary charged particle beam passing through and a first detection area opposite to the surface of the sample so as to collect secondary charged particles emitted from the scanned surface of the sample.

The charged particle source is an electron source of field emission, the primary charged particles are primary electrons emitted from the electron source, the primary charged particle beam is a primary electron beam formed by the primary electrons, the secondary charged particles are secondary electrons and backscattered electrons both emitted from the scanned surface of the sample, and the secondary electrons and the backscattered electrons forms a secondary electron beam and a backscattered electron beam respectively. The magnetic condenser lens has a radial magnetic-circuit gap opposite to the first selectable beam-limit aperture plate so as to generate a magnetic field deeply immersing the electron source. The deflection unit comprises at least one electrostatic deflector and one of the at least one electrostatic deflector is configured to generate an electrostatic deflection field superimposed onto a magnetic field of the magnetic objective lens along the optical axis so as to reduce off-axis aberrations due to a deflection. The magnetic condenser lens, the magnetic objective lens and the retarding field are configured so that the secondary electron beam and the backscattered electron beam respectively form no crossover on and below the first detection area of the first charged-particle detector.

All or most of the secondary electrons pass through the second beam-passing opening of the retarding electrode and the deflection unit and land on the first detection area of the first charged-particle detector. The retarding electrode may have a second detection area which is configured to collect most of the backscattered electrons. The charged particle beam apparatus may further comprise at least one peripheral electrode each located between the sample and the retarding electrode and having a field-passing opening aligned with the optical axis, wherein the at least one peripheral electrode is configured to focus the backscattered electrons with large polar angles to land inside the second detection area of the retarding electrode and not to influence the primary electrons. The charged particle beam apparatus may further comprise a second charged-particle detector, which is configured between the sample and the first charged particle detector to collect most of the backscattered electrons and have a fourth beam-passing opening aligned with the optical axis for the primary electron beam passing through. The charged particle beam apparatus may further comprise at least one peripheral electrode each located between the sample and the second charged particle-detector and having a field-passing opening aligned with the optical axis, wherein the at least one peripheral electrode is configured to focus the backscattered electrons with large polar angles to land inside a detection area of the second charged-particle detector and not to influence the primary electrons.

The magnetic objective lens is preferred to have an axial magnetic-circuit gap and a working distance about 5 mm-50 mm The charged particle beam apparatus may further comprise a second selectable beam-limit aperture plate, which is between the magnetic condenser lens and the first charged-particle detector and has a second plurality of beam-limit openings, wherein one of the second plurality of beam-limit openings in use is aligned with the optical axis and further limits the current of the primary electron beam to a second current value with respect to a focusing power of the magnetic condenser lens. The charged particle beam apparatus may further comprises a fixed aperture plate, which is above or stacked on an upper surface of the first charged-particle detector and comprises a protection opening aligned with the optical axis to prevent the primary electrons from hitting the first charged-particle detector. The protection opening of the fixed aperture plate may limit the current of the primary electron beam to a second current value with respect to a focusing power of the magnetic condenser lens. The charged particle beam apparatus may further comprise a fixed beam-limit aperture plate above the first selectable beam-limit aperture plate, which comprises an initial beam-limit opening aligned with the optical axis to limit the current of the primary electron beam to a current value a little larger than a largest probe current value of the apparatus. A voltage between the charged particle source and the sample may be dynamically adjusted to do auto-focusing of the primary electron beam onto the sample surface.

The present invention further provides an electron beam apparatus, which comprises an electron source of field emission, an accelerating electrode below the electron source, a fixed beam-limit aperture plate below the accelerating electrode, a first selectable beam-limit aperture plate below the fixed beam-limit aperture plate, a magnetic condenser lens below the first selectable beam-limit aperture plate, a fixed aperture plate below the magnetic condenser lens, a first electron detector below the fixed aperture plate, a magnetic objective lens below the first electron detector, a retarding electrode below or inside the magnetic objective lens, a sample stage below the retarding electrode for supporting a sample, and a deflection unit above the sample. The electron source of field emission emits primary electrons along a direction, wherein the direction is an optical axis of the electron beam apparatus and the primary electrons form a primary electron beam. The accelerating electrode comprises a first beam-passing opening aligned with the optical axis and for the primary electron beam passing through, wherein the electron source and the accelerating electrode are excited to generate an accelerating field therebetween to accelerate the primary electrons. The fixed beam-limit aperture plate comprises an initial beam-limit opening aligned with the optical axis, wherein the initial beam-limit opening limits a current of the primary electron beam to a first current value. The first selectable beam-limit aperture plate comprises a first plurality of beam-limit openings, wherein one of the first plurality of beam-limit openings in use is aligned with the optical axis and limits the primary electron beam to a second current value. The magnetic condenser lens, aligned with the optical axis, has a radial magnetic-circuit gap opposite to a lower surface of the first selectable beam-limit aperture plate and is configured to generate a magnetic field deeply immersing the electron source. The fixed aperture plate comprises a protection opening aligned with the optical axis. The first electron detector comprises a third beam-passing opening aligned with the optical axis for the primary electron beam passing through, wherein the fixed aperture plate is configured to prevent the primary electrons from hitting the first electron detector. The magnetic objective lens is aligned with the optical axis. The retarding electrode comprises a second beam-passing opening aligned with the optical axis for the primary electron beam passing through. The retarding electrode and the sample are set at potentials to generate a retarding field therebetween so that primary electrons are decelerated to land on a surface of the sample with kinetic energies lower than 5 keV. The magnetic condenser lens and the magnetic objective lens focus the primary electron beam to forms a focused probe spot onto the surface of the sample, wherein secondary electrons and backscattered electrons emerge from the sample surface where the primary electrons land on, thereby forming a secondary electron beam and a backscattered electron beam respectively. The deflection unit comprises at least one electrostatic deflector and one of the at least one deflector is configured to generate an electrostatic deflection field superimposed onto a magnetic field of the magnetic objective lens along the optical axis so as to reduce off-axis aberrations due to a deflection, wherein the magnetic condenser lens, the magnetic objective lens, the retarding field and the deflection unit are configured so that the secondary electron beam and the backscattered electron beam respectively form no crossover on and below the first electron detector, and all or most of the secondary electrons are collected by the first electron detector.

The magnetic objective lens is preferred to have an axial magnetic-circuit gap and a working distance about 5 mm-50 mm The retarding electrode may have a second detection area which is configured to collect most of the backscattered electrons. The electron beam apparatus may further comprise a second charged-particle detector, which is configured between the sample and the first charged particle detector to collect most of the backscattered electrons and have a fourth beam-passing opening aligned with the optical axis for the primary electron beam passing through. The protection opening of the fixed aperture plate may limit the current of the primary electron beam to a third current value with respect to a focusing power of the magnetic condenser lens. The electron beam apparatus may further comprise a second selectable beam-limit aperture plate between the magnetic condenser lens and the first electron detector, which has a second plurality of beam-limit openings, wherein one of the second plurality of beam-limit openings in use is aligned with the optical axis and limits the current of the primary electron beam to a third current value with respect to a focusing power of the magnetic condenser lens. The electron beam apparatus may further comprise at least one peripheral electrode each above the sample and having a field-passing opening aligned with the optical axis, wherein the at least one peripheral electrode is configured to focus the backscattered electrons with large polar angles so as to make more backscattered electrons be collected and not to influence the primary electrons.

The present invention also provides an electron beam apparatus, which comprises an electron source of field emission, a magnetic condenser lens below the electron source, an electron detector below the magnetic condenser lens, a magnetic objective lens below the electron detector, a sample stage below the magnetic objective lens for supporting a sample, and a deflection unit above the sample. The electron source emits primary electrons along a direction, wherein the direction is an optical axis of the electron beam apparatus and the primary electrons form a primary electron beam. The magnetic condenser lens, aligned with the optical axis, has a radial magnetic-circuit gap opposite to the electron source and is configured to generate a magnetic field deeply immersing the electron source. The electron detector comprises a first beam-passing opening aligned with the optical axis for the primary electron beam passing through. The magnetic objective lens is aligned with the optical axis. The magnetic condenser lens and the magnetic objective lens focus the primary electron beam to form a focused probe spot onto the surface of the sample. The deflection unit comprises at least one electrostatic deflector and one of the at least one deflector is configured to generate an electrostatic deflection field superimposed onto a magnetic field of the magnetic objective lens along the optical axis so as to reduce off-axis aberrations due to a deflection, wherein all or most of secondary electrons emitted from the sample surface are collected by the electron detector.

The electron beam apparatus may further comprise a first selectable beam-limit aperture plate which is located between the electron source and the magnetic condenser lens and comprises a first plurality of beam-limit openings, wherein one of the first plurality of beam-limit openings in use is aligned with the optical axis and limits the primary electron beam to a first current value. The electron beam apparatus may further comprise a second selectable beam-limit aperture plate which is between the magnetic condenser lens and the electron detector and has a second plurality of beam-limit openings, wherein one of the second plurality of beam-limit openings in use is aligned with the optical axis and limits the current of the primary electron beam to a second current value with respect to a focusing power of the magnetic condenser lens.

The present invention therefore provides a means to reduce Coulomb effect in a charged particle beam apparatus as early as possible so that the apparatus can provide high imaging resolution over a large probe current range by placing a first selectable beam-limit aperture plate between the charged particle source and the magnetic condenser lens.

The present invention therefore provides a means to reduce Coulomb effect in a charged particle beam apparatus so that the apparatus can provide a large probe current and a high imaging resolution by using a retarding field between the magnetic objective lens and the sample surface.

The present invention therefore provides a magnetic condenser lens with small geometric aberrations, which comprises a radial magnetic-circuit gap opposite to the charged particle source so as to generate a magnetic field deeply immersing the source.

The present invention therefore provides a means to realize a large FOV in a charged particle beam apparatus, which configures the magnetic objective lens with a long working distance and the deflection scanning with a swing deflection to reduce off-axis geometric aberrations and the scanning range of the SE beam on the SE detector.

The present invention therefore provides a means to protect a SE detector from being contaminated by primary electron beam, which places a fixed aperture plate above and close the SE detector and aligns a protection opening thereof with the optical axis.

The present invention therefore provides a means to increase BSE collection ratio without influencing PE beam focusing, which places at least one peripheral electrode just above the sample surface so as to focus BSEs with large polar angles.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

DETAILED DESCRIPTION OF EXAMPLE EMBODIMENTS

Figure 1A:
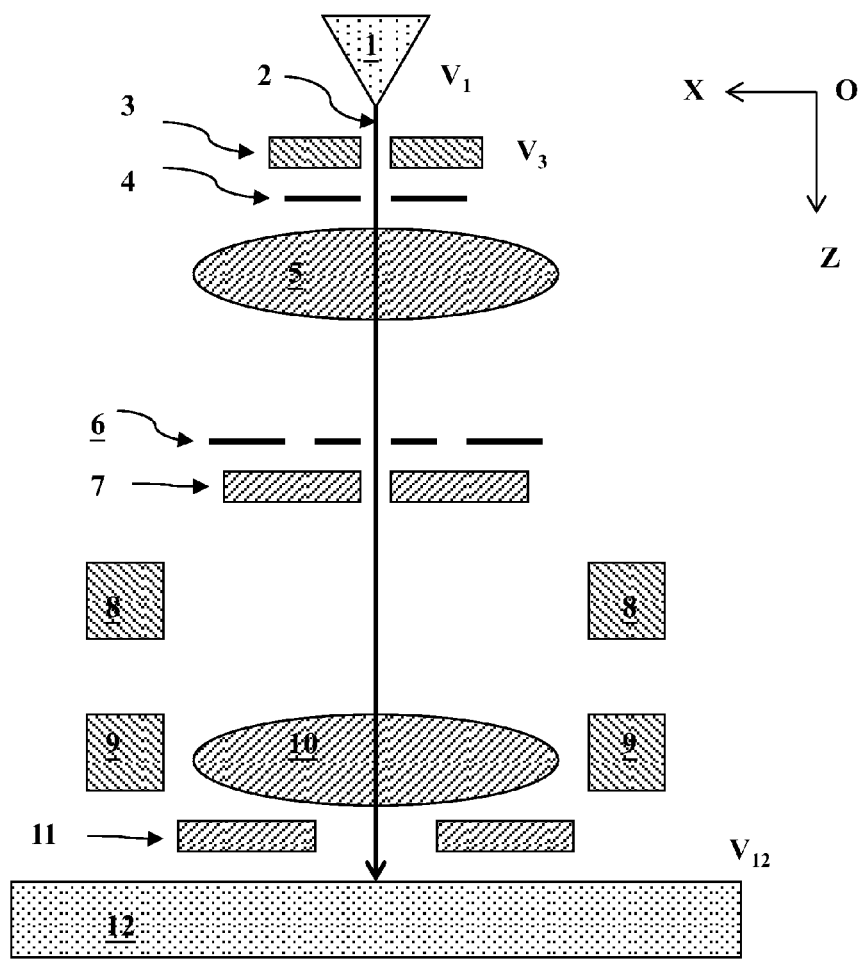
FIG. 1A is a schematic illustration of a conventional SEM for defect inspection and/or review in semiconductor manufacturing.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, X, Y and Z axes form Cartesian coordinate, and a PE beam propagates along Z axis (Z-axis) in +Z direction.

In this invention, "axial" means "in the optical axis direction of an apparatus or a lens" and is in the Z-axis direction, while "radial" means "in a direction perpendicular to the optical axis".

Figure 1B:
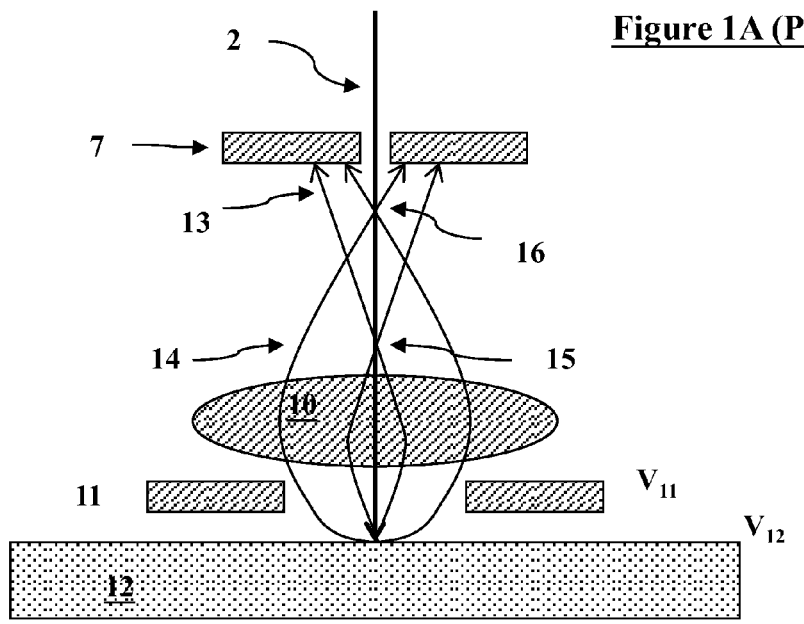
FIG. 1B is a schematic illustration of SE and BSE beams in accordance with the conventional SEM shown in FIG. 1A.
Figure 3A:
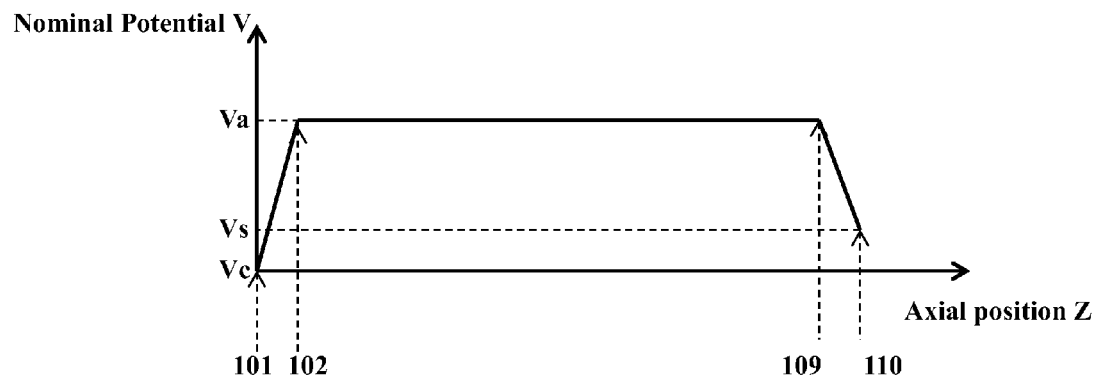
FIG. 3A is a schematic illustration of a potential distribution in accordance with the embodiment of the present invention shown in FIG. 2.
Figure 4A:
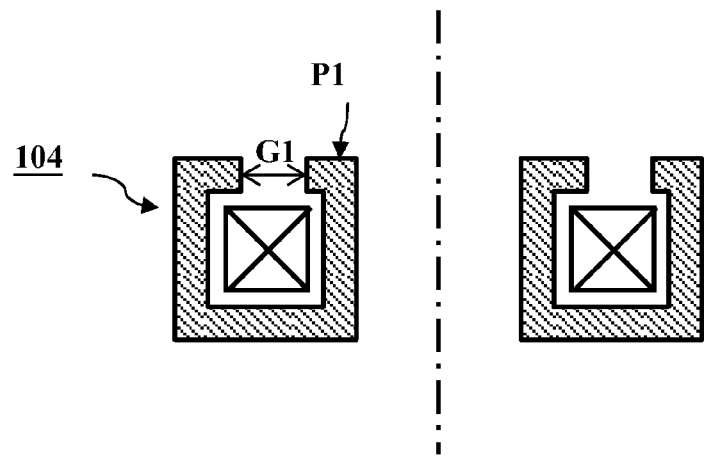
FIGS. 4A-4C are respectively a schematic illustration of a magnetic condenser lens in accordance with another embodiment of the present invention.
Figure 4B:
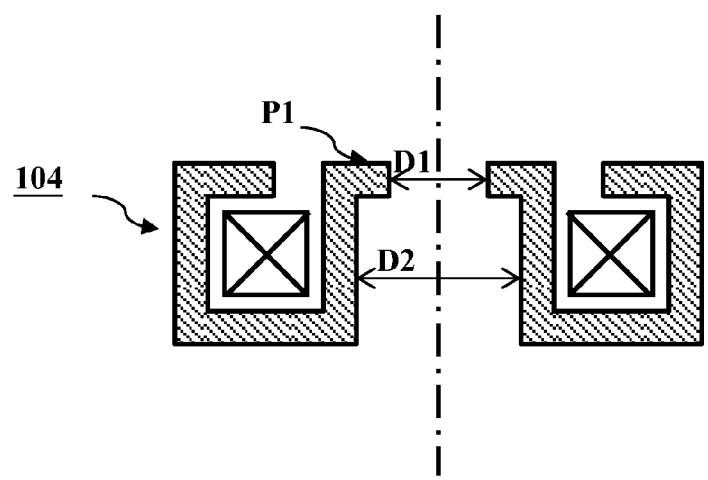
Figure 4C:
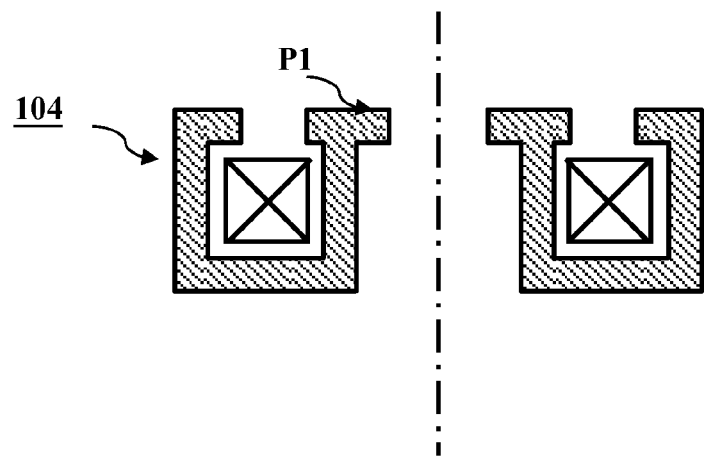
Figure 5A:
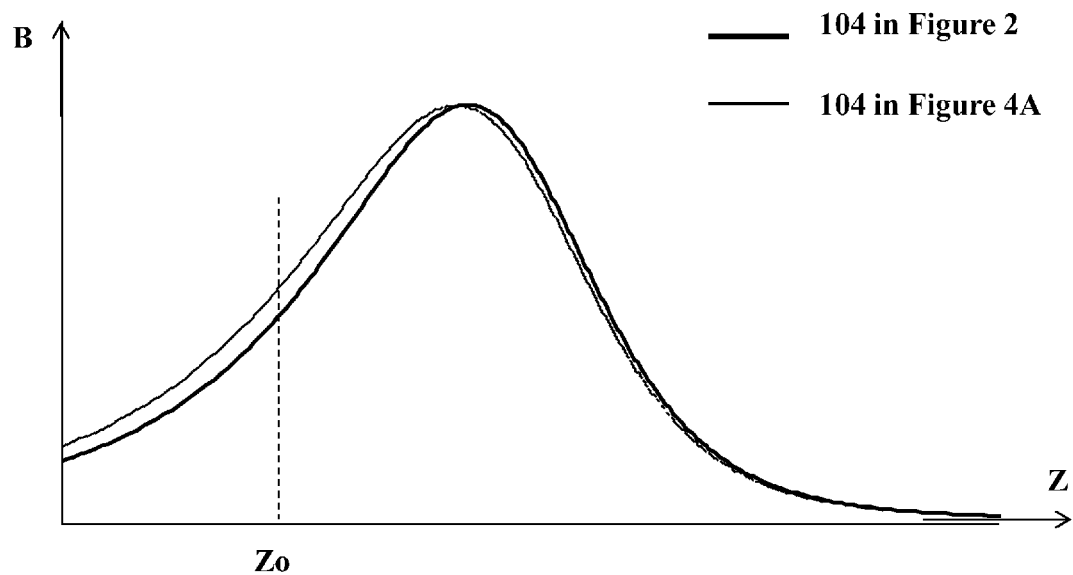
FIG. 5A and FIG. 5B are schematic illustrations of on-axis magnetic field distributions of the magnetic condenser lenses in accordance with the embodiments of the present invention shown in FIG. 2 and FIGS. 4A-4C.
Figure 5B:
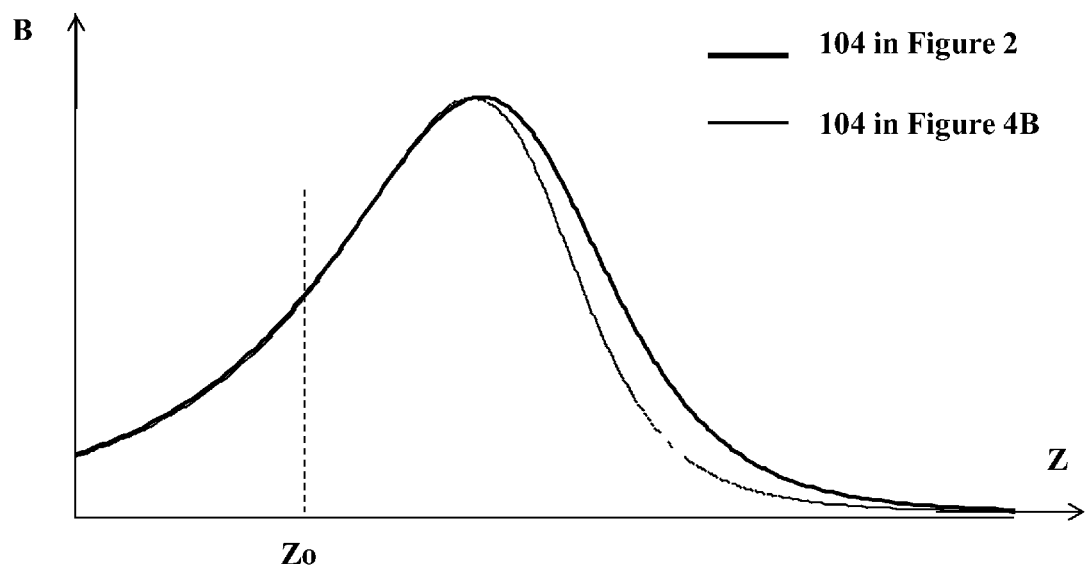

As shown in FIG. 1A and FIG. 1B and explained in DESCRIPTION OF THE PRIOR ART, a conventional SEM or LVSEM will not be capable for an application which requires a probe current and a FOV both as large as many times of those of the prior art and simultaneously providing SE image and BSE image. The present invention provides a design of LVSEM which can meet the foregoing requirements of the application. At first, an elementary embodiment of LVSEM is proposed as a first embodiment of the invention and shown in FIG. 2, FIG. 3A and FIG. 3B. Secondly, some other embodiments of the condenser lens used in the first embodiment are provided and shown in FIGS. 4A-4C and their advantages are shown in FIG. 5A and FIG. 5B. Next, one or more beam-limit apertures are added to the first embodiment so as to improve imaging resolution over a large range of probe current, and consequently some example embodiments are shown in FIGS. 6A-6E. Finally, to improve SE or BSE collection ratio in the foregoing embodiments, one or more peripheral electrodes are added to. The corresponding embodiments and advantages thereof are shown in FIG. 7A, FIG. 7B, FIG. 8A and FIG. 8B. Detailed description and mechanism of the embodiments of the present invention are described next Firstly, the elementary embodiment of LVSEM shown in FIG. 2 will be introduced. Primary electrons are emitted along the Z-axis direction from an electron source 101 which is set at a potential Vc. The primary electrons form the PE beam B1 and Z-axis is taken as the optical axis of the elementary embodiment. The primary electrons then are accelerated a high kinetic energy equal to e·(Vc−Va) by an accelerating electrode (anode) 102 which is set at a potential Va much higher than the potential Vc, wherein the e denotes charge of an electron. The accelerated PE beam B1 then is partially limited by an opening of a selectable beam-limit aperture 103-1, which has several openings with different radial sizes respectively for obtaining various desired current values, and is focused by a magnetic condenser lens 104. After passing a small center hole of an upper detector 105 and two deflectors 107 and 108, the PE beam B1 next is further focused by a magnetic objective lens 106 so as to finally become a best focused probe spot on the upper surface of a sample 110 which is at a potential Vs a little higher than the potential Vc. Then, the PE beam B1 passes a lower detector 109 and crosses a retarding field generated between the detector 109 and the upper surface of the sample 110. Consequently, the PE beam B1 is decelerated to land on the upper surface of the sample 110 with low kinetic energy equal to e·(Vc−Vs). The potential distribution along the optical axis is shown in FIG. 3A.

Figure 3B:
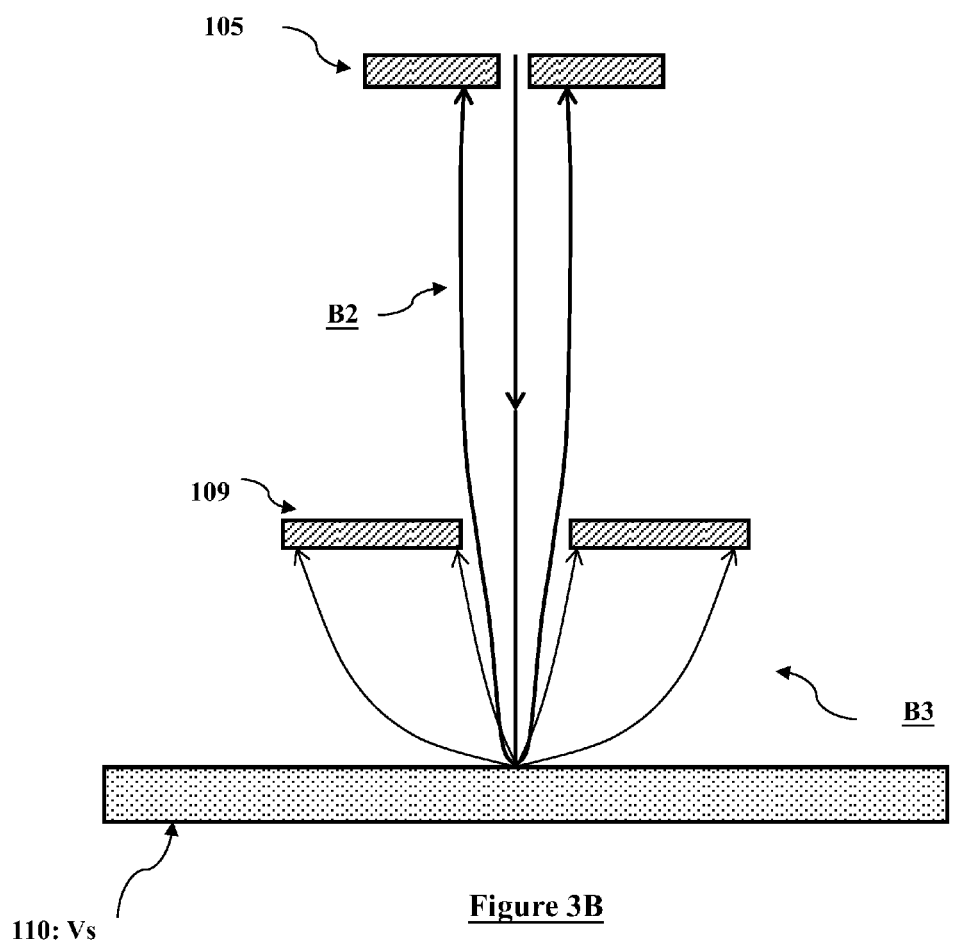
FIG. 3B is a schematic illustration of detections of SE and BSE beams in accordance with the embodiment of the present invention shown in FIG. 2.

Secondary electrons and backscattered electrons will emerge from the surface of the sample 110 where the PE beam B1 lands on, and forms SE beam B2 and BSE beam B3 respectively. The SE beam B2 and BSE beam B3 go upwards to land on the two detectors 105 and 109 respectively, as shown in FIG. 3B. In FIG. 3B, the SE beam B2 is immediately accelerated and appropriately focused by the retarding field so as to fully go through the hole of the lower detector 109. After passing the lower detector 109, the SE beam B2 goes through the two deflectors 108 and 107 and the magnetic objective lens 106. The SE beam B2 is further focused by the magnetic objective lens 106, but its crossover is above and far away from the upper detector 105. Actually only a very small part (such as 10%) of the electrons in the SE beam B2 passes the center hole of the upper detector 105 and then goes through the crossover, and the rest land on the upper detector 105 and never reach the crossover. Therefore the crossover of the SE beam B2 almost does not appear in fact. Similarly, the BSE beam B3 is immediately accelerated and focused by the retarding field too. However, because the energy of the BSE beam B3 is much higher than that of the SE beam B2, the focusing effect on the BSE beam B3 is much weaker than that on the SE beam B2. Consequently, more than half of backscattered electrons land on the lower detector 109. For the rest of backscattered electrons, the most part hit the two deflectors 108 and 107, and a small part is collected by the upper detector 105. To reduce the possibility that electrons are emitted from the two deflectors 108 and 107 due to the BSE bombardment, the inner surfaces and side surfaces thereof can be coated with materials having low yields of SE and BSE. Therefore most of the electrons collected by the upper detector 105 come from the SE beam B2. In a case which does not require BSE collection, the lower detector 109 can simply be an electrode or removed. In the case that the lower detector 109 is removed, the retarding field will start from the lower of the lower ends of the magnetic objective 106 and the lower deflector 108.

The two electrostatic deflectors 107 and 108 together dynamically deflect the PE beam B1 so as to make the low-energy best focused PE probe spot scan the upper surface of the sample 110. The signals of the upper and lower detectors change with respect to the SE beam B2 and BSE beam B3 will individually and simultaneously generate an SE image and a BSE image of the sample surface.

To get a high image resolution with respect to a large FOV and a large probe current, the size of the PE probe spot on the sample surface must be as small as possible. The probe spot size basically depends on the Gaussian imaging size Dg of electron source 101 and the sizes of the blurs respectively due to geometric aberrations, diffraction and Coulomb Effect occurring on the path from the electron source 101 to the surface of the sample 110. The diffraction effect will be negligible in comparison with geometric aberrations and Coulomb Effect. Geometric aberrations and Coulomb Effect dramatically increase with an increase in probe current, and the former also increase as FOV becomes large. Therefore several special means are used in the elementary embodiment of LVSEM shown in FIG. 2.

At first, the electron source 101 uses a Field Emission Cathode which can provide high emission brightness. The voltage Va−Vc between the electron source 101 and the anode 102 provides an appropriate electric field so that a virtual crossover of the PE beam B1 is formed behind the emission surface of the Field Emission Cathode. The virtual crossover is taken as a virtual source for the following imaging system. The virtual source has a high angular intensity (0.1~1 mA/Sr) and a small size (10~50 nm), and both are necessary for getting a small PE probe spot size with respect to a large FOV and a large probe current.

For the PE beam B1 passing through the opening of the selectable beam-limit aperture 103-1, the beam current depends on the beam divergent angle β and the angular intensity of the virtual source. The beam divergent angle β is limited by the size of the opening in use. Therefore, for obtaining a certain value of the beam current, the higher the angular intensity is used, the smaller the beam divergent angle will be. On the sample surface, the geometric aberrations increase with the convergent angle α of the PE beam B1. The convergent angle α is the product of the beam divergent angle β and the angular magnification Ma of the imaging system. Therefore, the geometric aberrations increase dramatically as the probe current increases, especially spherical aberration due to its dependence on $\alpha^3$. Therefore the high angular intensity will be helpful to reduce the imaging blur due to geometric aberrations.

The Gaussian imaging size Dg is equal to the product of the dimension magnification M of the imaging system and the virtual source Ds. Obviously, the smaller Ds makes the Dg smaller. Furthermore, for a certain Dg, the small Ds allows the imaging system to use a large dimension magnification M. On the one hand, the large dimension magnification M corresponds to a small angular magnification Ma as shown in Equation (1), which is especially effective in the retarding case wherein (Va−Vc) is much large than (Vs−Vc). As the angular magnification Ma decreases, the convergent angle α of the PE beam B1 on the sample surface becomes small, and thereby reducing geometric aberrations. On the other hand, the large dimension magnification M also corresponds to a small dimension magnification of the objective lens with respect to SE and BSE, thereby allowing the upper detector 105 to be able to collect SEs coming from a lager FOV on the sample surface.

$$M_a = \frac{1}{M} \cdot \sqrt{\frac{V_a - V_c}{V_s - V_c}} \qquad (1)$$

Secondly, the selectable beam-limit aperture 103-1 is located close to the virtual source so as to reduce the imaging blur due to Coulomb Effect. As well known, Coulomb Effect increases with the increase of the beam current, so the Coulomb Effect will be weakened as much as possible by early cutting the current of the PE beam B1 to the desired probe current value.

As well known, each kind of geometric aberrations depends on its coefficient, beam angle and/or beam position both on an image plane, and the beam position determines FOV. Accordingly, the imaging system and scanning system are configured to obtain the desired large dimension magnification M and reduce geometric aberrations by reducing geometric aberration coefficients and the convergent angle α of the PE beam B1 on the sample surface. Inside the imaging system, the condenser lens 104 and the objective lens 106 are configured to respectively generate a magnetic field, wherein the focusing power center of the former is as close to the virtual source as possible (i.e. deeply immersing the electron source 101) and the latter is a little away from the surface of the sample 110 compared to the conventional LVSEM. Inside the scanning system, two electrostatic deflectors are used and the lower one 108 is located close to the magnetic-circuit gap of the objective lens 106 so as to superimpose its deflection field onto the magnetic field thereof along the optical axis.

The on-axis geometric aberrations mainly come from the condenser lens 104, and the aberration coefficients will reduce as making the focusing power center thereof further close to the virtual source. Due to the existence of the selectable beam-limit aperture 103-1, the condenser lens 104 cannot be physically located much close to the virtual source. To solve this problem, the condenser lens 104 is designed to have a radial magnetic-circuit gap opposite to the virtual source. As the gap is opened further away from the optical axis Z, the magnetic field of the condenser lens 104 will be spurted further upward and its focusing power center is moved closer to the virtual source. FIGS. 4A-4C show three embodiments of the condenser lens 104 other than the one in FIG. 2. In FIG. 4A, the gap G1 is directly moved away from the optical axis Z by increasing the outer diameter of the upper end of the inner pole-piece P1 of the condenser lens 104. FIG. 5A shows the on-axis distributions of the magnetic fields of the condenser lens 104 in FIG. 2 and FIG. 4A respectively in a bold line and a slim line, where the slim line has a peak on the left side of the peak of the bold line and as a result its focusing power center is closer to the position Zo of the virtual source than the bold line. In FIG. 4B, the magnetic field is pushed upward by reducing the inner diameter D1 of the upper end of the inner pole-piece P1. FIG. 5B shows the on-axis distributions of the magnetic fields of the condenser lens 104 in FIG. 2 and FIG. 4B respectively in a bold line and a slim line, where the slim line has a tail weaker than the bold line and consequently its focusing power center is closer to the position Zo of the virtual source than the bold line. In FIG. 4C, the means used in FIG. 4A and 4B are combined.

Figure 6A:
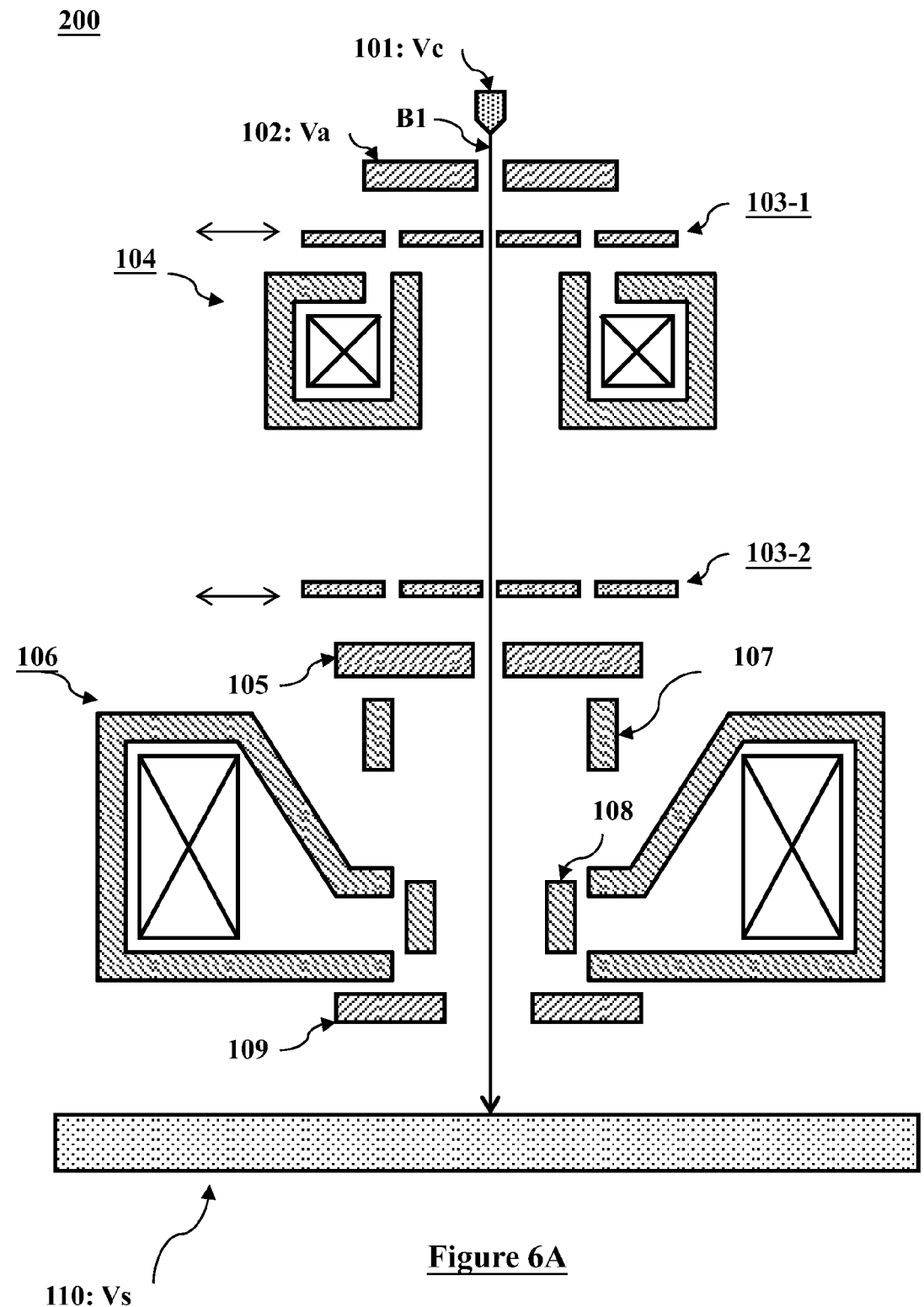
FIGS. 6A-6E are respectively a schematic illustration of a LVSEM in accordance with another embodiment of the present invention.
Figure 6B:
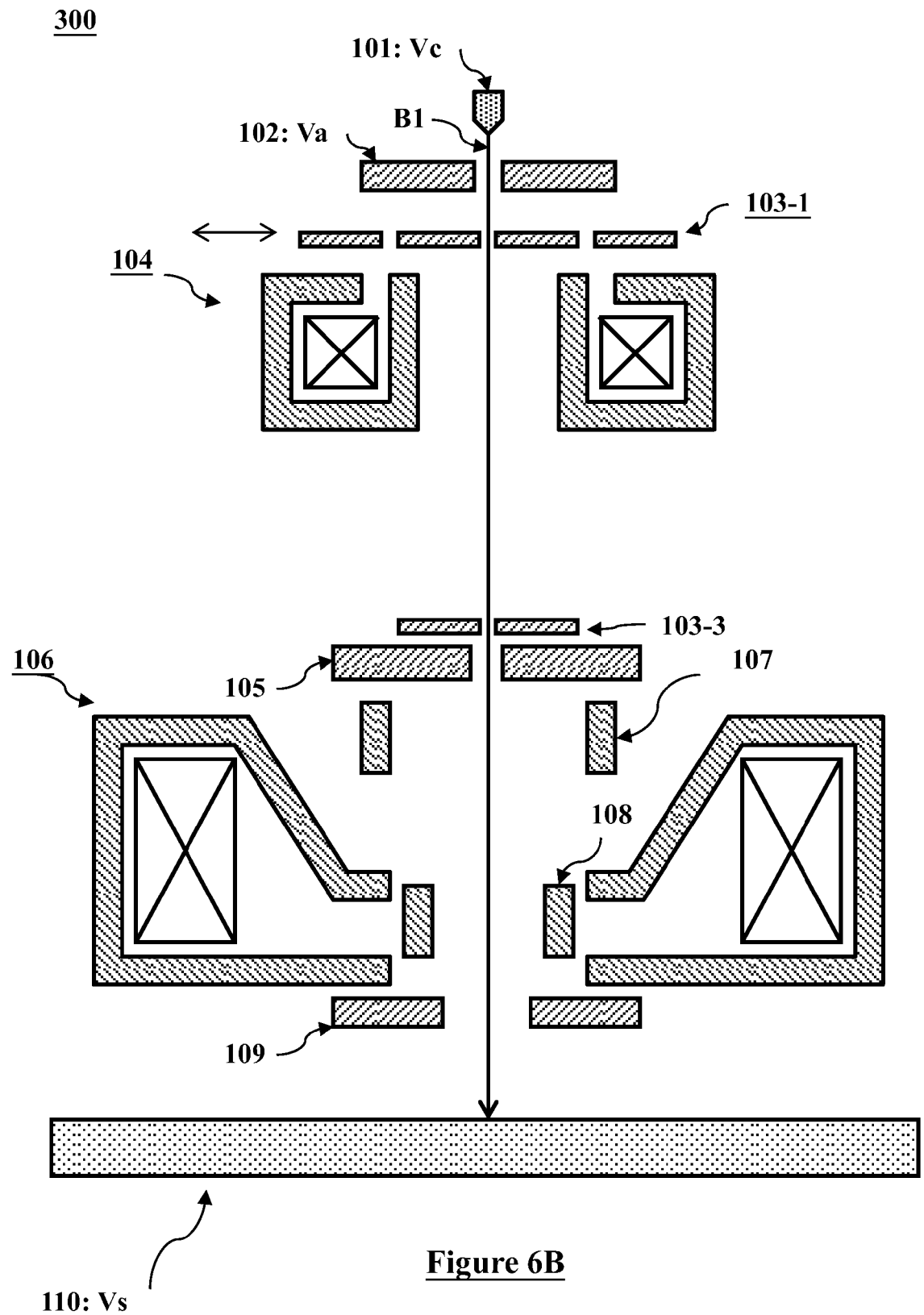
Figure 6C:
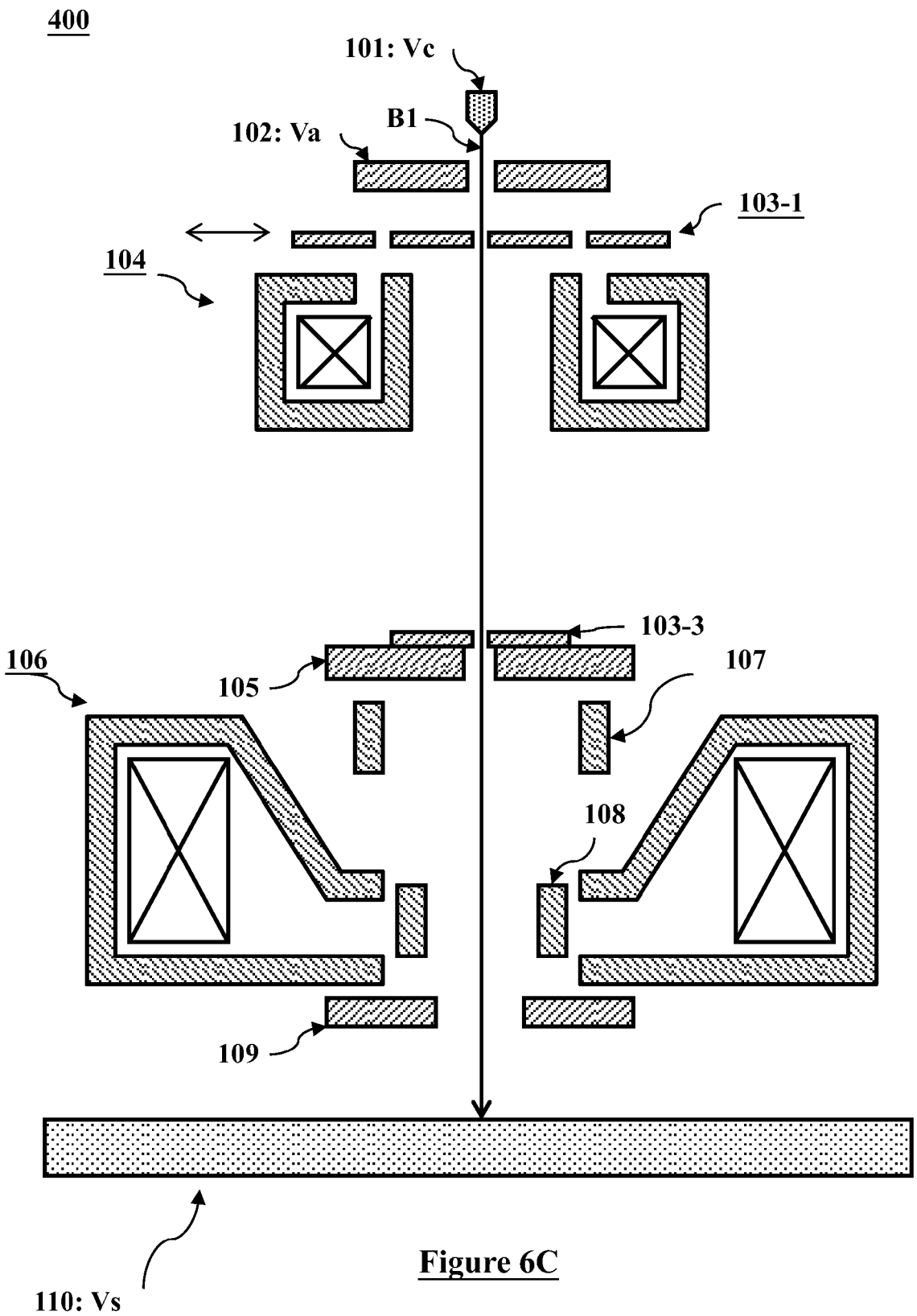
Figure 6D:
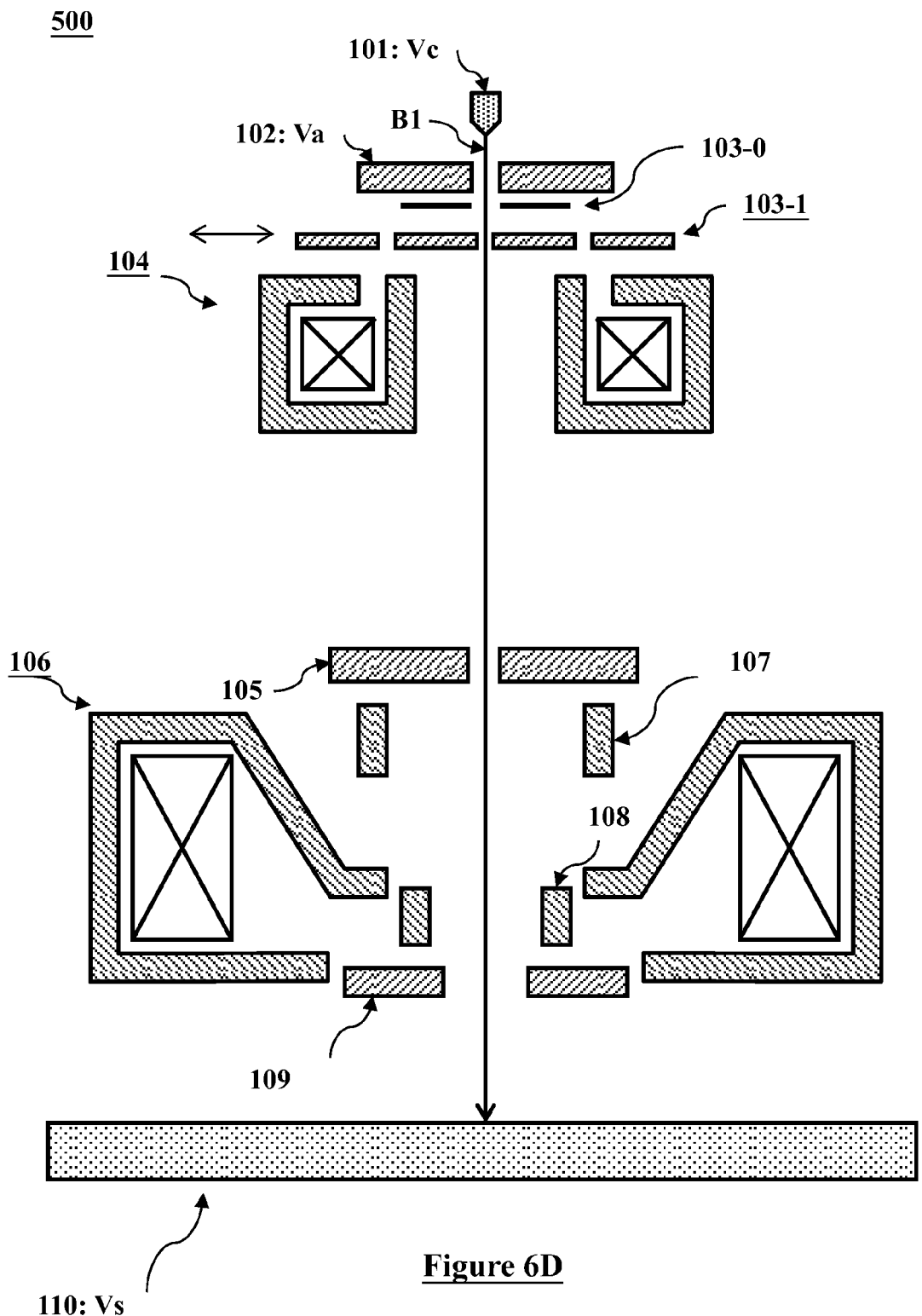
Figure 6E:
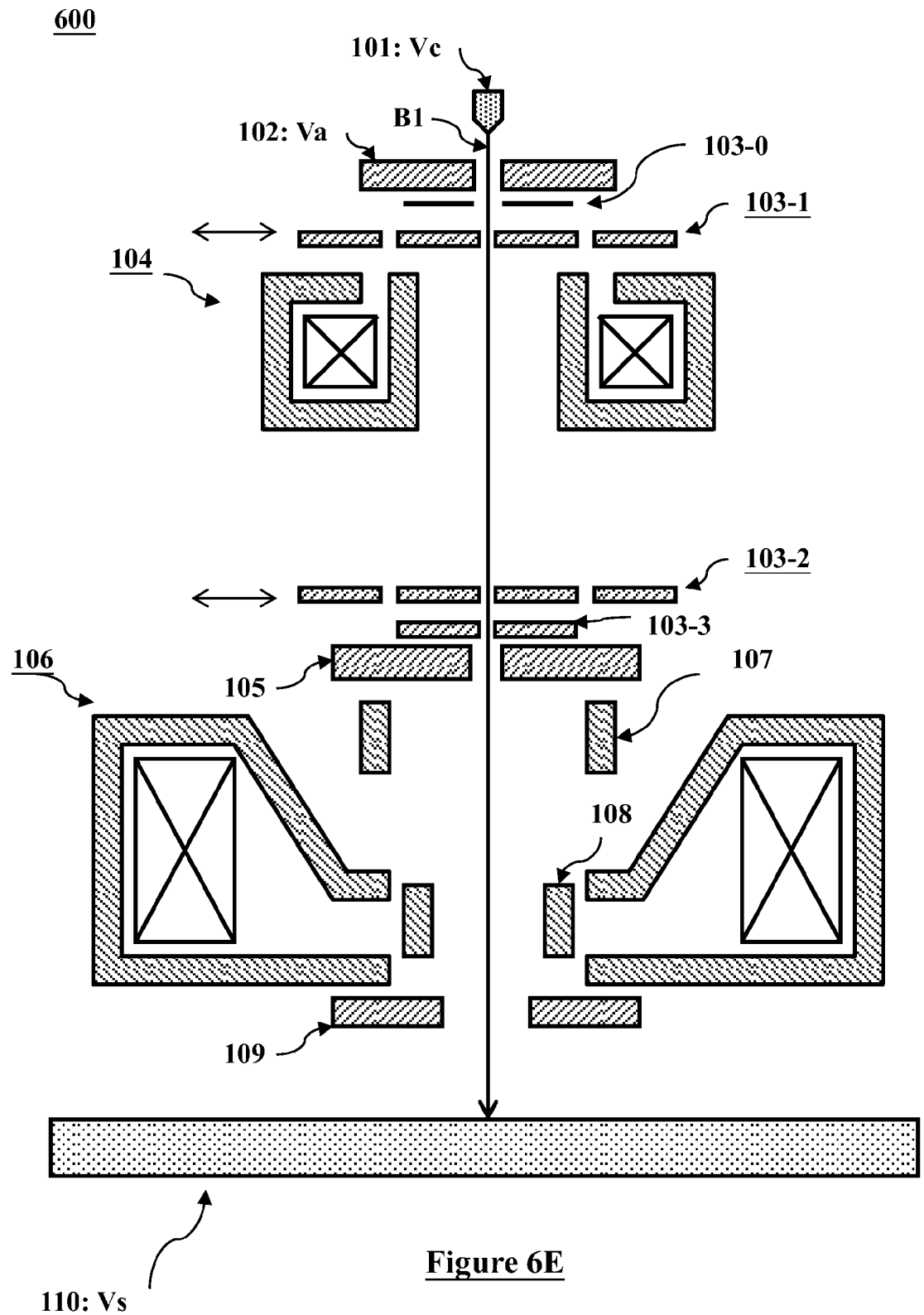

The off-axis geometric aberrations mainly come from the magnetic field of the magnetic objective lens 106 and the retarding field above the sample surface when the PE beam B1 is deflected away from the optical axis Z by the two deflectors 107 and 108. The aberration coefficients will reduce with decreases in the tilt angle and radial shift of the PE beam B1 during passing the magnetic and retarding fields. Accordingly, the magnetic field of the magnetic objective lens 106 is located much far away from the surface of the sample 110, such as 5 mm-50 mm instead of 2 mm in the prior art. The deflection scanning can be done by either or both of two deflectors 107 and 108. To minimize the off-axis aberrations due to deflection, it is advantageous to overlap one deflection field with the objective lens field. The deflection field of the lower deflector 108 is superimposed onto the magnetic field of the magnetic objective lens 106. Therefore it is better to use the deflector 108 if the deflection is done by one deflector. The two deflectors 107 and 108 together can realize an advanced deflection named as swing deflection (proposed in U.S. Pat. No. 6,392,231) to further reduce off-axis aberrations. It is better to place the lower detector 109 close to or even inside the magnetic objective lens 106 as shown in FIG. 6D. Therefore, the retarding field can start just below the magnetic objective lens 106 and ends on the surface of the sample 110. Consequently, the foregoing arrangements dramatically reduce the coefficient of the Field Curvature aberration and thereby ensuring the feasibility of the large FOV of several mm The Coulomb Effect of the PE beam B1 comes from the interactions among all the electrons on the path of the PE beam B1 from the electron source 101 to the surface of the sample 110, i.e. the electrons of the PE beam B1 and the electrons of the SE beam B2 and BSE beam B3. The interactions strengthen as increases in any or both of beam current and the beam current density of each beam. The currents of SE beam B2 and BSE beam B3 depend on the probe current of the PE beam B1, so their effects become obvious when the large probe current is used. The most effective way to weaken the electron interactions is to reduce each of the current densities of the three beams B1~B3. Accordingly, the foregoing arrangements of the imaging system and the scanning system are also configured by taking into account reducing current density of each beam. The convergent angle α of the PE beam B1 is selected by a balance between geometric aberrations and electron interactions thereof. The magnetic field of the objective lens 106 and the retarding field are configured to have weak focusing powers so as to make no appearance of the real crossovers of both the SE beam B2 and the BSE beam B3 below or on the detector 105.

Figure 2:
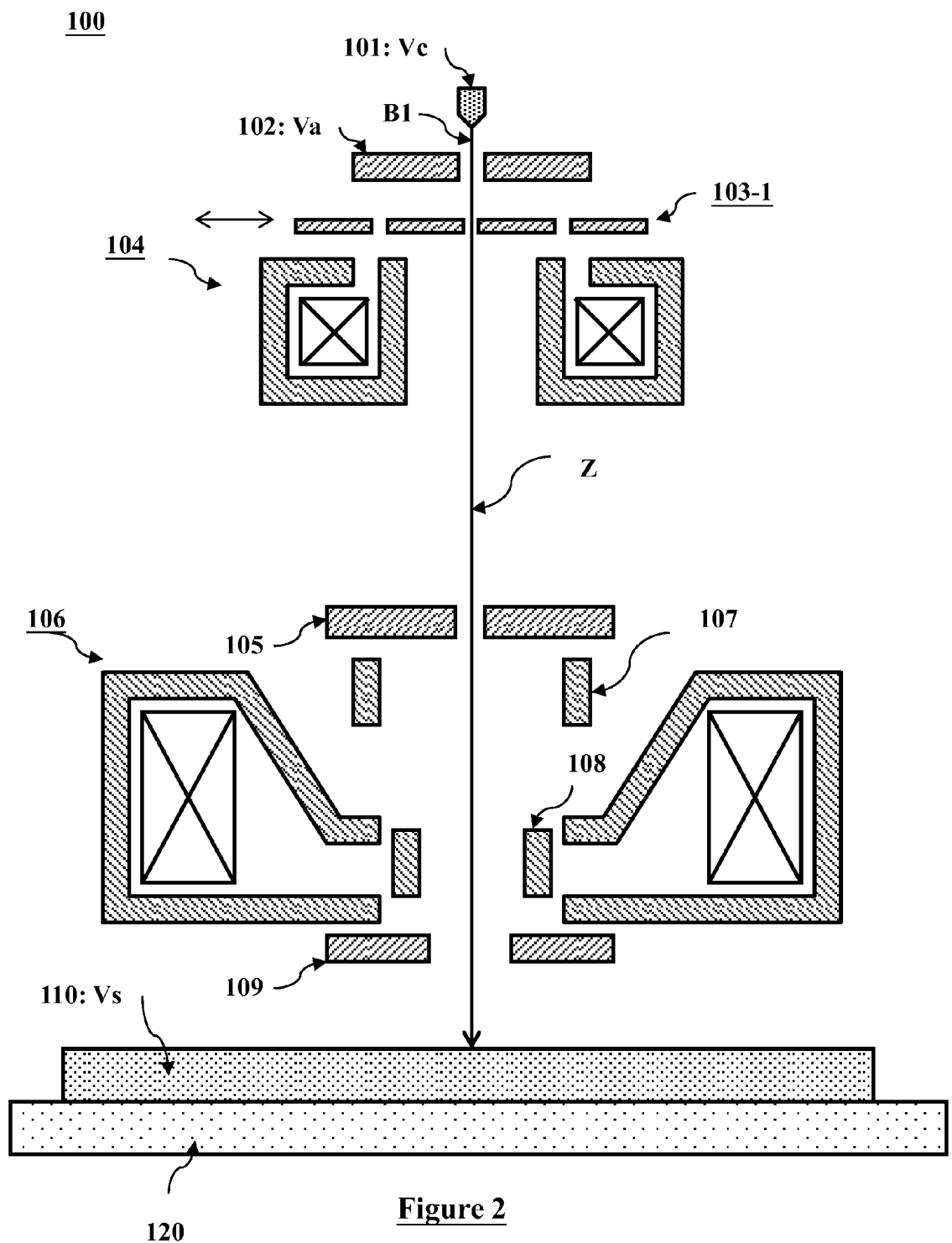
FIG. 2 is a schematic illustration of a LVSEM in accordance with one embodiment of the present invention.

In FIG. 2, the available number of the probe current values are discontinuous, which are determined by the number of the opening sizes in the selectable beam-limit aperture 103-1. To enable the probe current changing continuously, one more selectable beam-limit aperture 103-2 with several openings can be used below the condenser lens 104 as shown in FIG. 6A. In such a way, the probe current is finally limited by the radial size of the opening in use of the selectable beam-limit aperture 103-2. Adjusting the focusing power of the condenser lens 104 can change the beam current passing the opening so as to change the probe current. To limit the increase of the probe spot size due to the change in the foregoing focusing power, each opening covers a limited range of the probe current and the selectable beam-limit aperture 103-2 has several openings with different radial sizes to cover the whole range of the probe current.

In FIG. 2, the upper detector 105 has a center hole aligned with the optical axis so as to let the PE beam B1 pass through. A part of the SE beam will pass through the center hole, which is a loss for SE collection. To limit the loss, the radial size of the center hole has to be as small as possible, preferred to be a little larger than the size of the PE beam B1. In such a case the PE beam B1 may hit the side wall of the center hole during system alignment or adjusting the optical axis, and the contamination due to the beam hitting will induce additional aberrations to the PE beam B1. To avoid the beam hitting, a fixed beam-limit aperture 103-3 can be used above the upper detector 105 to protect the center hole from the beam hitting. As shown in FIG. 6B and FIG. 6C, the fixed beam-limit aperture 103-3 is aligned with the optical axis and close to or even contacts the upper detector 105. Besides protecting the center hole of the upper detector 105 during system alignment, the fixed beam-limit aperture 103-3 can also be used to finally limit the PE beam B1 and thereby getting a certain range of probe current by means of adjusting the focusing power of the condenser lens 104. To avoid instability of electron emission of the electron source 101 due to the disturbances possibly occurring during changing to use another opening of the selectable beam-limit aperture 103-1, a conventional fixed gun aperture 103-0 can be used and located above the selectable beam-limit aperture 103-1, as shown in FIG. 6D. The means used in FIGS. 6A-6D can be combined, such as the way shown in FIG. 6E.

Figure 7A:
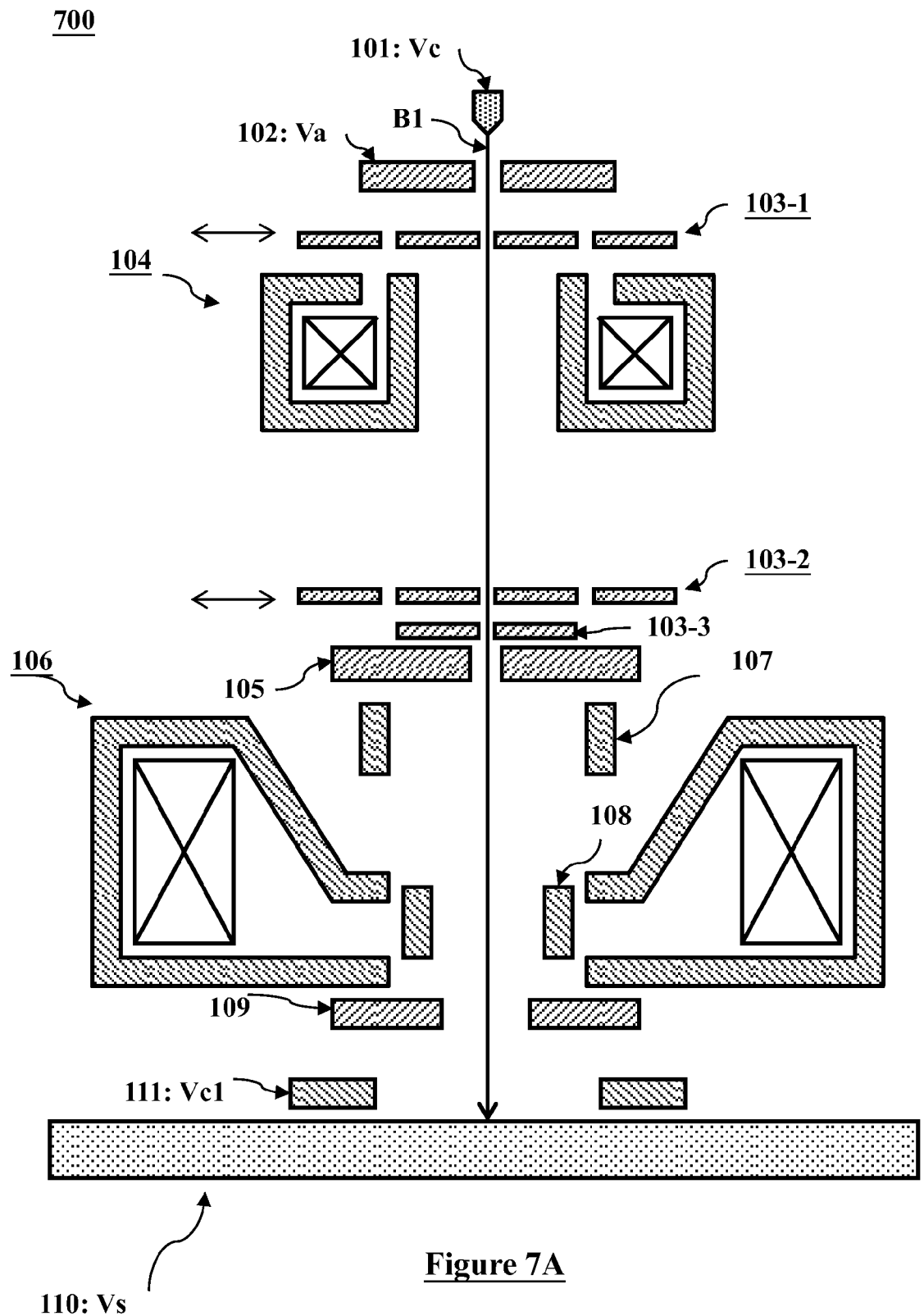
FIG. 7A is a schematic illustration of a LVSEM in accordance with another embodiment of the present invention.
Figure 7B:
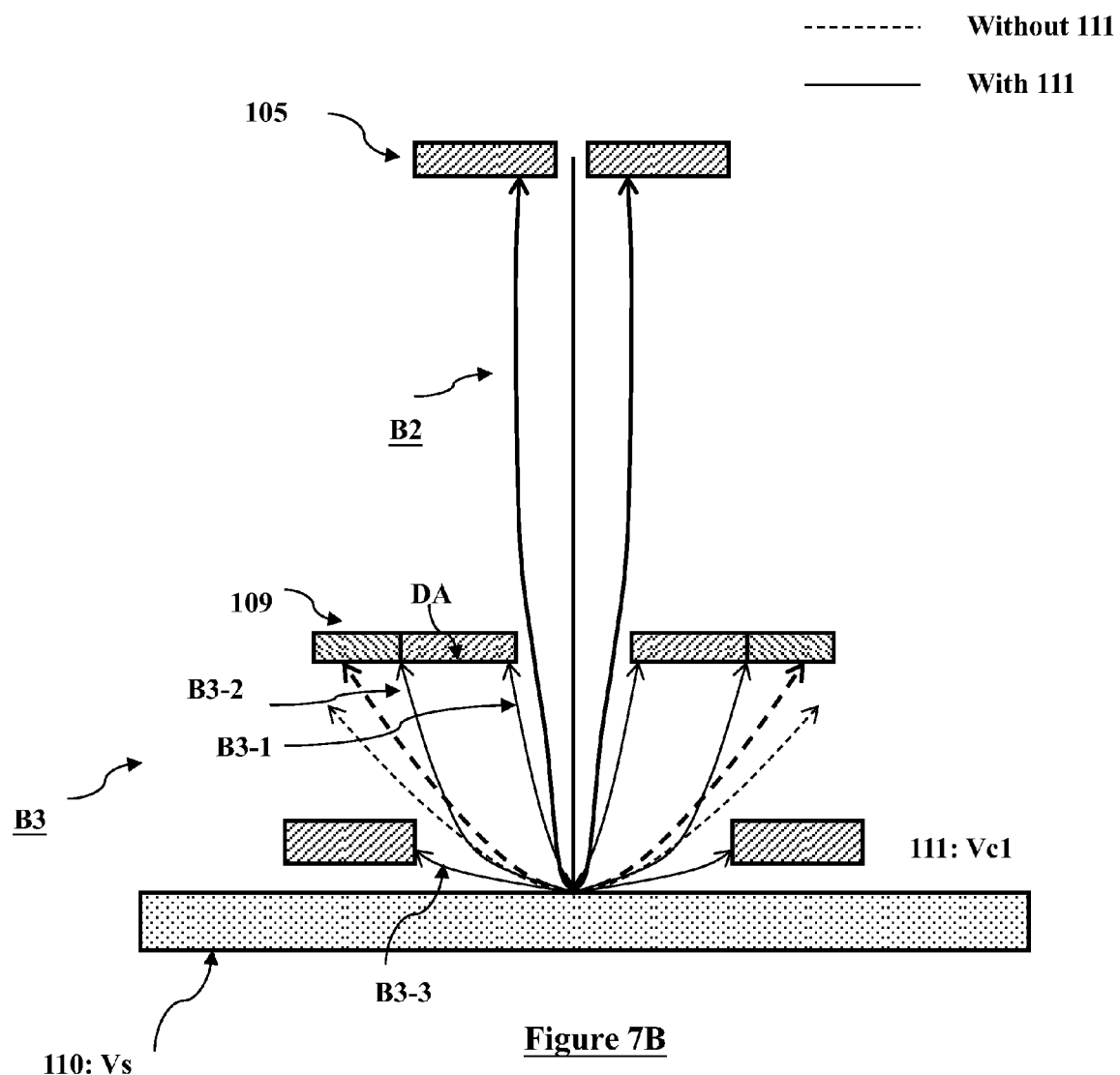
FIG. 7B is a schematic illustration of detections of SE and BSE beams in accordance with the embodiment of the present invention shown in FIG. 7A.
Figure 8A:
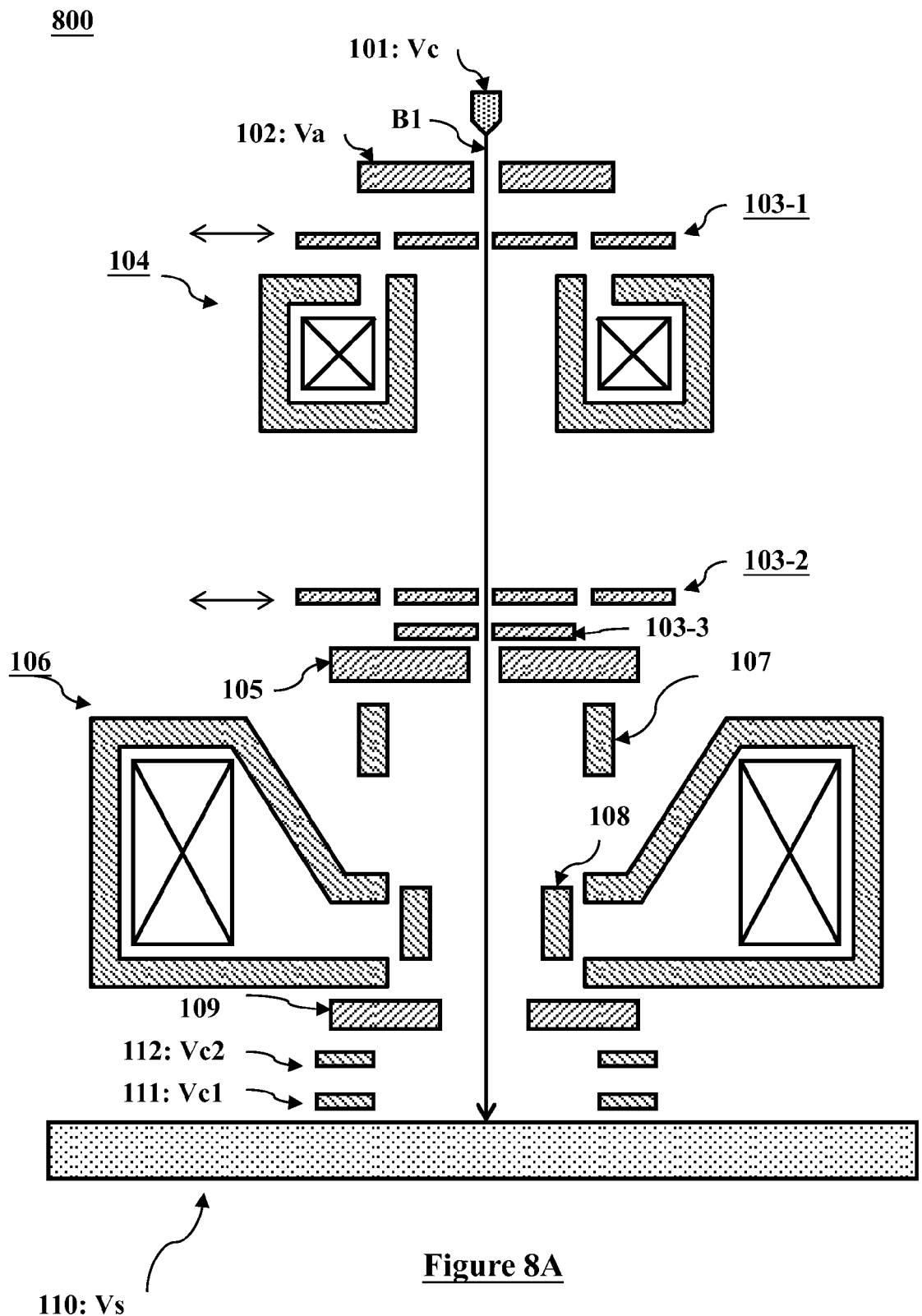
FIG. 8A is a schematic illustration of a LVSEM in accordance with another embodiment of the present invention.

As shown in FIG. 3B, the BSEs having polar angles larger than certain values will land on the lower detector 109. To collect the BSEs as much as possible, the lower detector 109 needs to have a large detection area. However, the detection area of a detector cannot be as large as expected because of the practical limitations such as its electric respond characteristics. Next, a means is proposed to increase the collection ratio of the BSE without increasing the detection area of the lower detector 109. FIG. 7A and FIG. 8A take the embodiment similar to FIG. 6E as an example to respectively show one embodiment of the means, and FIG. 7B and FIG. 8B respectively show how the means works.

In FIG. 7A, a peripheral electrode 111 with a large inner diameter is inserted between the lower detector 109 and the sample 110, and at a potential Vc1. The peripheral electrode 111 is configured to obviously change the electrostatic field in the area where the peripheral electrons of the BSE beam B3 pass but not influence the electrostatic field in the area where the electrons of the PE beam B1 will pass. Accordingly, the inner diameter of the peripheral electrode 111 is better as large as several times of the FOV, and the potential Vc1 is adjusted with respect to the landing energy e(Vc−Vs). FIG. 7B shows the trajectory changes of the peripheral electrons of the BSE beam B3 when Vc1 is equal to Vs and the inner diameter is 6 times of the FOV. In FIG. 7B, DA is the detection area of the lower detector 109, and the trajectories in a bold dash line and a slim dash line are respectively the trajectories of the peripheral electrons B3-2 and B3-3 when the peripheral electrode 111 is absent. The electrostatic field change due to the peripheral electrode 111 has no influence on the trajectory of the inner electron B3-1, but focuses the peripheral electron B3-2 to land inside the detection area DA of the lower detector 109. The outermost peripheral electron B3-3 still cannot be collected.

Figure 8B:
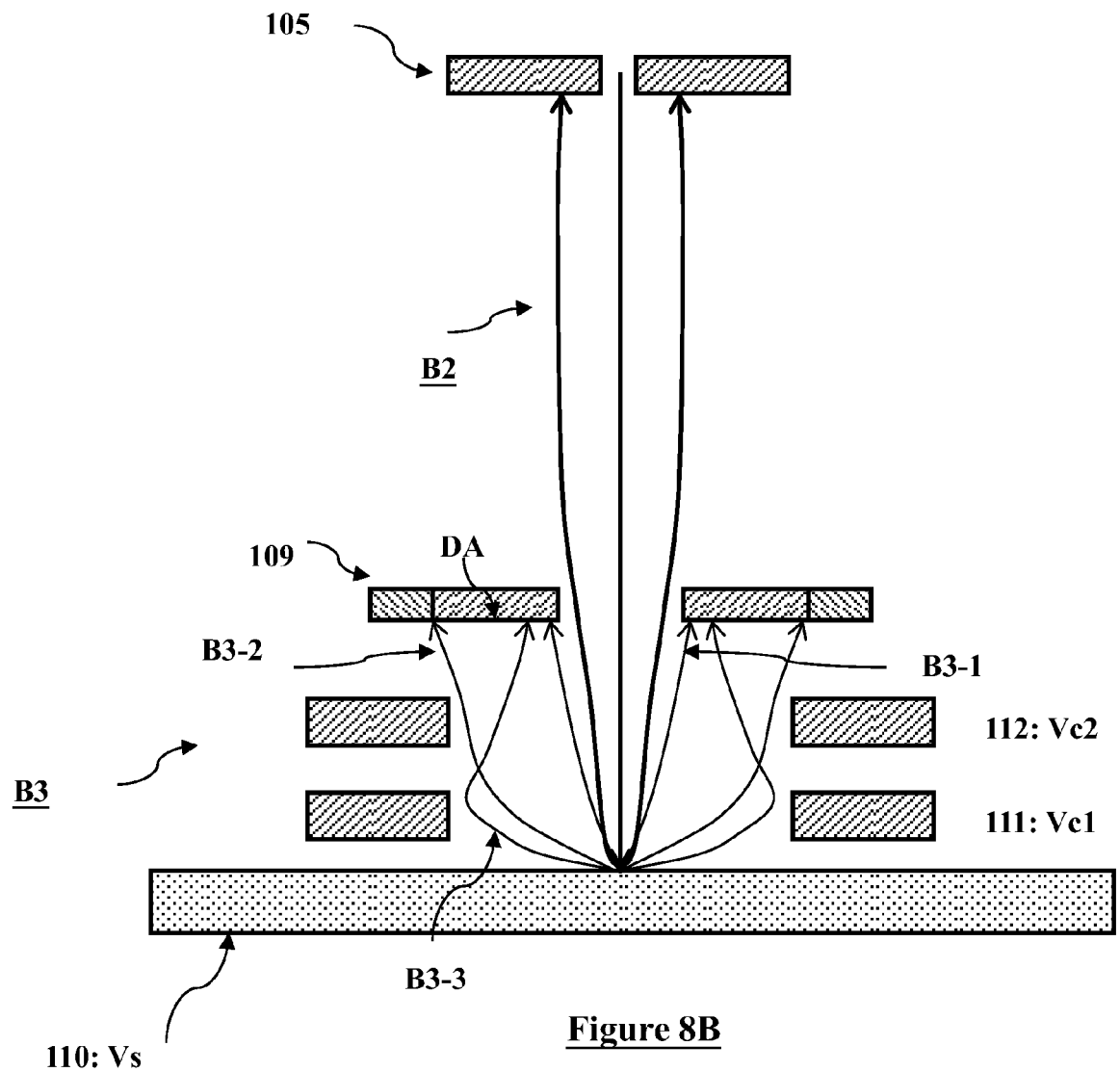
FIG. 8B is a schematic illustration of detections of SE and BSE beams in accordance with the embodiment of the present invention shown in FIG. 8A.

In FIG. 8A, two peripheral electrodes 111 and 112 with large inner diameters are inserted between the lower detector 109 and the sample 110, and at potentials Vc1 and Vc2 respectively. The peripheral electrodes 111 and 112 both are configured to obviously change the electrostatic field in the area where the peripheral electrons of the BSE beam B3 pass but not to influence the electrostatic field in the area where the electrons of the PE beam B1 will pass. Accordingly, both the inner diameters of the peripheral electrodes 111 and 112 are better as large as several times of the FOV, and the potentials Vc1 and Vc2 are adjusted with respect to the landing energy e(Vc−Vs). FIG. 8B shows the trajectory changes of the peripheral electrons of the BSE beam B3 when Vc1 is lower than Vs, Vc2 is equal to the potential of the lower detector 109 and the two inner diameters are 6 times of the FOV. In FIG. 8B, DA is the detection area of the lower detector 109. The electrostatic field change due to the peripheral electrodes 111 and 112 has no influence on the trajectory of the inner electron B3-1, but focuses the peripheral electrons B3-2 and B3-3 to land inside the detection area DA of the lower detector 109. The strong electrostatic field in the area close to the gap of the peripheral electrodes 111 and 112 focuses the electron B3-3 more strongly than the electron B3-2.

In FIG. 2, the best focused probe spot may defocus during scanning the sample surface. On the one hand, the axial position of the sample surface may shift due to the vibration of the sample stage 120 or the topographic variation of the sample 110. On the other hand, the electric excitation of each element such as the condenser lens 104 and objective lens 106 may drift. Therefore dynamic auto-focusing is necessary during scanning sample. To get a high throughput of defect inspection or review in semiconductor manufacturing, a high scanning speed is required. Accordingly the auto-focusing must be achieved in a high speed. In FIG. 2, the high speed auto-focusing can be done by dynamically adjusting the voltage (Vs−Vc) between the electron source 101 and the sample 110 to compensate the defocusing of the probe spot during scanning the sample.

In summary this invention proposes an electron beam apparatus for inspecting a sample surface with LVSEM. The apparatus is especially competent for the inspection applications which foremost require a throughput much higher than the prior art, such as TSV defect inspection in 3-D integration of semiconductor industry. The high throughput is realized by providing a probe current and a FOV both several times of those of the prior art. Accordingly several means are proposed to avoid obvious degradation of image resolution due to the increases in Coulomb Effect and geometric aberrations, and increase efficiency and uniformity of secondary charged particle collection. The magnetic condenser lens with a radial magnetic-circuit gap generates a magnetic field to deeply immerse the charged particle source. The deflection scanning is done by swing deflection. A retarding field close the sample enables the primary charged particles to travel with high kinetic energies through most portions of their paths and be subsequently decelerated just above the sample so as to land on the sample with energies lower than 5 keV. A selectable beam-limiting aperture plate is placed close to the charged particle source to cut the current of the primary charged particle beam as early as possible. One or more peripheral electrodes are placed to focus backscattered charged particles with large polar angles to be collected. A fixed aperture is used to prevent the secondary charged particle detector from being charged by the primary charged particles.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended

What is claimed is:

1. A charged particle beam apparatus, comprising:
a charged particle source, which emits primary charged particles along a direction, wherein said direction is an optical axis of said charged particle beam apparatus and said primary charged particles form a primary charged particle beam;
an accelerating electrode, which is located below said charged particle source and comprises a first beam-passing opening aligned with said optical axis for said primary charged particle beam passing through, wherein said charged particle source and said accelerating electrode are excited to generate an accelerating field therebetween to accelerate said primary charged particles;
a first selectable beam-limit aperture plate, which is located below said accelerating electrode and comprises a first plurality of beam-limit openings, wherein one of said first plurality of beam-limit openings in use is aligned with said optical axis and limits a current of said primary charged particle beam to a first current value;
a magnetic condenser lens, which is located below said first selectable beam-limit aperture plate and aligned with said optical axis;
a magnetic objective lens, which is located below said magnetic condenser lens and aligned with said optical axis;
a retarding electrode, which is located inside or below said magnetic objective lens and comprises a second beam-passing opening aligned with said optical axis for said primary charged particle beam passing through;
a sample stage, which is located below said retarding electrode and supports a sample, wherein said retarding electrode and said sample are electrically excited to generate a retarding field therebetween so that primary charged particles are decelerated to land on a surface of said sample with kinetic energies lower than 5 keV, wherein said magnetic condenser lens and said magnetic objective lens focus said primary charged particle beam to forms a focused probe spot onto said surface of said sample;
a deflection unit, which is above said sample and deflects said primary charged particle beam so as to make said focused probe spot scan said surface of said sample; and
a first charged-particle detector, which is located above said deflection unit, comprises a third beam-passing opening aligned with said optical axis for said primary charged particle beam passing through and a first detection area opposite to said surface of said sample so as to collect secondary charged particles emitted from said scanned surface of said sample.

2. The charged particle beam apparatus according to claim 1, wherein said charged particle source is an electron source of field emission, said primary charged particles are primary electrons emitted from said electron source, said primary charged particle beam is a primary electron beam formed by said primary electrons, said secondary charged particles are secondary electrons and backscattered electrons both emitted from said scanned surface of said sample, and said secondary electrons and said backscattered electrons forms a secondary electron beam and a backscattered electron beam respectively.

3. The charged particle beam apparatus according to claim 2, wherein said magnetic condenser lens has a radial magnetic-circuit gap opposite to said first selectable beam-limit aperture plate so as to generate a magnetic field deeply immersing said electron source.

4. The charged particle beam apparatus according to claim 3, wherein said deflection unit comprises at least one electrostatic deflector and one of said at least one electrostatic deflector is configured to generate an electrostatic deflection field superimposed onto a magnetic field of said magnetic objective lens along said optical axis so as to reduce off-axis aberrations due to a deflection.

5. The charged particle beam apparatus according to claim 4, wherein said magnetic condenser lens, said magnetic objective lens and said retarding field are configured so that said secondary electron beam and said backscattered electron beam respectively form no crossover on and below said first detection area of said first charged-particle detector.

6. The charged particle beam apparatus according to claim 5, wherein all or most of said secondary electrons pass through said second beam-passing opening of said retarding electrode and said deflection unit and land on said first detection area of said first charged-particle detector.

7. The charged particle beam apparatus according to claim 6, wherein said retarding electrode has a second detection area which is configured to collect most of said backscattered electrons.

8. The charged particle beam apparatus according to claim 7, further comprising at least one peripheral electrode each located between said sample and said retarding electrode and having a field-passing opening aligned with said optical axis, wherein said at least one peripheral electrode is configured to focus said backscattered electrons with large polar angles to land inside said second detection area of said retarding electrode and not to influence said primary electrons.

9. The charged particle beam apparatus according to claim 6, further comprising a second charged-particle detector, which is configured between said sample and said first charged particle detector to collect most of said backscattered electrons and have a fourth beam-passing opening aligned with said optical axis for said primary electron beam passing through.

10. The charged particle beam apparatus according to claim 9, further comprising at least one peripheral electrode each located between said sample and said second charged particle-detector and having a field-passing opening aligned with said optical axis, wherein said at least one peripheral electrode is configured to focus said backscattered electrons with large polar angles to land inside a second detection area of said second charged-particle detector and not to influence said primary electrons.

11. The charged particle beam apparatus according to claim 6, wherein said magnetic objective lens has an axial magnetic-circuit gap and a working distance about 5 mm-50 mm.

12. The charged particle beam apparatus according to claim 6, further comprising a second selectable beam-limit aperture plate, which is between said magnetic condenser lens and said first charged-particle detector and has a second plurality of beam-limit openings, wherein one of said second plurality of beam-limit openings in use is aligned with said optical axis and further limits said current of said primary electron beam to a second current value with respect to a focusing power of said magnetic condenser lens.

13. The charged particle beam apparatus according to claim 6, further comprising a fixed aperture plate, which is above or stacked on an upper surface of said first charged-particle detector and comprises a protection opening aligned with said optical axis to prevent said primary electrons from hitting said first charged-particle detector.

14. The charged particle beam apparatus according to claim 13, wherein said protection opening of said fixed aperture plate limits said current of said primary electron beam to a second current value with respect to a focusing power of said magnetic condenser lens.

15. The charged particle beam apparatus according to claim 6, further comprising a fixed beam-limit aperture plate above said first selectable beam-limit aperture plate, which comprises an initial beam-limit opening aligned with said optical axis to limit said current of said primary electron beam to a current value a little larger than a largest probe current value of said apparatus.

16. The charged particle beam apparatus according to claim 6, wherein a voltage between said charged particle source and said sample is dynamically adjusted to do auto-focusing of said primary electron beam onto said sample surface.

17. An electron beam apparatus, comprising:
an electron source of field emission, which emits primary electrons along a direction, wherein said direction is an optical axis of said electron beam apparatus and said primary electrons form a primary electron beam;
an accelerating electrode, which is located below said electron source and comprises a first beam-passing opening aligned with said optical axis and for said primary electron beam passing through, wherein said electron source and said accelerating electrode are excited to generate an accelerating field therebetween to accelerate said primary electrons;
a fixed beam-limit aperture plate, which is below said accelerating electrode and comprises an initial beam-limit opening aligned with said optical axis, wherein said initial beam-limit opening limits a current of said primary electron beam to a first current value;
a first selectable beam-limit aperture plate, which is located below said fixed beam-limit aperture plate and comprises a first plurality of beam-limit openings, wherein one of said first plurality of beam-limit openings in use is aligned with said optical axis and limits said primary electron beam to a second current value;
a magnetic condenser lens, which is aligned with said optical axis and located below said first selectable beam-limit aperture plate and has a radial magnetic-circuit gap opposite to a lower surface thereof and configured to generate a magnetic field deeply immersing said electron source;
a fixed aperture plate, which is below said magnetic condenser lens and comprise a protection opening aligned with said optical axis;
a first electron detector, which is below said fixed aperture plate and comprises a third beam-passing opening aligned with said optical axis for said primary electron beam passing through, wherein said fixed aperture plate is configured to prevent said primary electrons from hitting said first electron detector;
a magnetic objective lens, which is located below said first electron detector and aligned with said optical axis;
a retarding electrode, which is located below or inside said magnetic objective lens and comprises a second beam-passing opening aligned with said optical axis for said primary electron beam passing through;
a sample stage, which is located below said retarding electrode and supports a sample, wherein said retarding electrode and said sample are set at potentials to generate a retarding field therebetween so that primary electrons are decelerated to land on a surface of said sample with kinetic energies lower than 5 keV, wherein said magnetic condenser lens and said magnetic objective lens focus said primary electron beam to forms a focused probe spot onto said surface of said sample, wherein secondary electrons and backscattered electrons emerge from said sample surface where said primary electrons land on, thereby forming a secondary electron beam and a backscattered electron beam respectively; and
a deflection unit, which is above said sample and comprises at least one electrostatic deflector and one of said at least one deflector is configured to generate an electrostatic deflection field superimposed onto a magnetic field of said magnetic objective lens along said optical axis so as to reduce off-axis aberrations due to a deflection, wherein said magnetic condenser lens, said magnetic objective lens, said retarding field and said deflection unit are configured so that said secondary electron beam and said backscattered electron beam respectively form no crossover on and below said first electron detector, and all or most of said secondary electrons are collected by said first electron detector.

18. The electron beam apparatus according to claim 17, wherein said magnetic objective lens has an axial magnetic-circuit gap and a working distance about 5 mm-50 mm.

19. The electron beam apparatus according to claim 18, wherein said retarding electrode has a second detection area which is configured to collect most of said backscattered electrons.

20. The electron beam apparatus according to claim 19, wherein said protection opening of said fixed aperture plate limits said current of said primary electron beam to a third current value with respect to a focusing power of said magnetic condenser lens.

21. The electron beam apparatus according to claim 19, further comprising a second selectable beam-limit aperture plate, which is between said magnetic condenser lens and said first electron detector and has a second plurality of beam-limit openings, wherein one of said second plurality of beam-limit openings in use is aligned with said optical axis and limits said current of said primary electron beam to a third current value with respect to a focusing power of said magnetic condenser lens.

22. The electron beam apparatus according to claim 21, further comprising at least one peripheral electrode each located between said sample and said retarding electrode and having a field-passing opening aligned with said optical axis, wherein said at least one peripheral electrode is configured to focus said backscattered electrons with large polar angles to land inside a second detection area of said retarding electrode and not to influence said primary electrons.

23. The electron beam apparatus according to claim 18, further comprising a second charged-particle detector, which is configured between said sample and said first charged particle detector to collect most of said backscattered electrons and have a fourth beam-passing opening aligned with said optical axis for said primary electron beam passing through.

24. The electron beam apparatus according to claim 23, wherein said protection opening of said fixed aperture plate limits said current of said primary electron beam to a third current value with respect to a focusing power of said magnetic condenser lens.

25. The electron beam apparatus according to claim 23, further comprising a second selectable beam-limit aperture plate, which is between said magnetic condenser lens and said first electron detector and has a second plurality of beam-limit openings, wherein one of said second plurality of beam-limit openings in use is aligned with said optical axis and limit said current of said primary electron beam to a third current value with respect to a focusing power of said magnetic condenser lens.

26. The electron beam apparatus according to claim 25, further comprising at least one peripheral electrode each located between said sample and said second electron detector and having a field-passing opening aligned with said optical axis, wherein said at least one peripheral electrode is configured to focus said backscattered electrons with large polar angles to land inside a second detection area of said second electron detector and not to influence said primary electrons.

27. An electron beam apparatus, comprising:
- an electron source of field emission, which emits primary electrons along a direction, wherein said direction is an optical axis of said electron beam apparatus and said primary electrons form a primary electron beam;
- a magnetic condenser lens aligned with said optical axis and located below said electron source, which has a radial magnetic-circuit gap opposite to said electron source and is configured to generate a magnetic field deeply immersing said electron source;
- an electron detector, which is below said magnetic condenser lens and comprises a first beam-passing opening aligned with said optical axis for said primary electron beam passing through;
- a magnetic objective lens, which is located below said electron detector and aligned with said optical axis;
- a sample stage, which is located below said magnetic objective lens and supports a sample, wherein said magnetic condenser lens and said magnetic objective lens focus said primary electron beam to form a focused probe spot onto said surface of said sample; and
- a deflection unit, which is above said sample and comprises at least one electrostatic deflector and one of said at least one deflector is configured to generate an electrostatic deflection field superimposed onto a magnetic field of said magnetic objective lens along said optical axis so as to reduce off-axis aberrations due to a deflection, wherein all or most of secondary electrons emitted from the sample surface are collected by said electron detector.

28. The electron beam apparatus according to claim 27, further comprising a first selectable beam-limit aperture plate which is located between said electron source and said magnetic condenser lens and comprises a first plurality of beam-limit openings, wherein one of said first plurality of beam-limit openings in use is aligned with said optical axis and limits said primary electron beam to a first current value.

29. The electron beam apparatus according to claim 28, further comprising a second selectable beam-limit aperture plate which is located between said magnetic condenser lens and said electron detector and comprises a second plurality of beam-limit openings, wherein one of said second plurality of beam-limit openings in use is aligned with said optical axis and limits said primary electron beam to a second current value.

* * * * *